United States Patent
Felix et al.

(10) Patent No.: US 12,386,761 B2
(45) Date of Patent: Aug. 12, 2025

(54) MEMORY AND ROUTING MODULE FOR USE IN A COMPUTER SYSTEM

(71) Applicant: Graphcore Limited, Bristol (GB)

(72) Inventors: Stephen Felix, Bristol (GB); Simon Stacey, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 0 days.

(21) Appl. No.: 18/061,167

(22) Filed: Dec. 2, 2022

(65) Prior Publication Data

US 2023/0281136 A1    Sep. 7, 2023

(30) Foreign Application Priority Data

Mar. 1, 2022 (GB) ...................................... 2202800
Mar. 1, 2022 (GB) ...................................... 2202802

(51) Int. Cl.
| | |
|---|---|
| *G06F 30/394* | (2020.01) |
| *G06F 13/16* | (2006.01) |
| *G06F 13/40* | (2006.01) |
| *G06F 30/39* | (2020.01) |

(52) U.S. Cl.
CPC ...... *G06F 13/1668* (2013.01); *G06F 13/4068* (2013.01); *G06F 13/409* (2013.01)

(58) Field of Classification Search
None
See application file for complete search history.

(56) References Cited

U.S. PATENT DOCUMENTS

| | | | |
|---|---|---|---|
| 10,671,554 B1* | 6/2020 | Bharadwaj | ............. G06F 13/20 |
| 10,943,851 B1* | 3/2021 | Elsherbini | .......... H01L 25/0652 |
| 11,694,940 B1* | 7/2023 | Mathuriya | ........ H01L 23/49816 |
| | | | 257/295 |
| 2009/0245257 A1* | 10/2009 | Comparan | ............. H04L 45/60 |
| | | | 370/392 |

(Continued)

FOREIGN PATENT DOCUMENTS

| | | |
|---|---|---|
| WO | 2019032271 A1 | 2/2019 |
| WO | 2019076715 A1 | 4/2019 |

OTHER PUBLICATIONS

Search Report and Written Opinion dated Feb. 27, 2023 for International Application No. PCT/EP2022/079146. 14 pages.

(Continued)

*Primary Examiner* — Hyun Nam
(74) *Attorney, Agent, or Firm* — HAYNES AND BOONE, LLP

(57) ABSTRACT

A memory and routing module includes a substrate and a connection component. The connection component is attached to the substrate and includes multiple pins that connect the module to a corresponding connection component on a motherboard. The substrate is connected to a dynamic random-access memory, DRAM, chip, and a routing chip. The routing chip includes a memory controller, multiple connections, and routing logic. The multiple connections include a first group between the memory controller and the DRAM chip and a second group of connections with the pins of the connection component. The routing logic routes data between the second group of connections and the first group of connections.

25 Claims, 20 Drawing Sheets

(56) References Cited

U.S. PATENT DOCUMENTS

| | | | |
|---|---|---|---|
| 2011/0082970 A1* | 4/2011 | Rohleder | G11C 7/1075 |
| | | | 711/E12.007 |
| 2014/0109035 A1* | 4/2014 | Pan | G06F 30/392 |
| | | | 716/137 |
| 2014/0266416 A1* | 9/2014 | Dally | H05K 1/11 |
| | | | 327/564 |
| 2015/0127890 A1* | 5/2015 | Brainard | G06F 3/068 |
| | | | 711/103 |
| 2016/0092362 A1* | 3/2016 | Barron | G06F 15/167 |
| | | | 711/146 |
| 2017/0131933 A1* | 5/2017 | Kim | G06F 30/392 |
| 2017/0220499 A1 | 8/2017 | Gray | |
| 2018/0081583 A1* | 3/2018 | Breternitz | G06F 12/00 |
| 2018/0102776 A1 | 4/2018 | Chandrasekar | |
| 2019/0044515 A1 | 2/2019 | Gutala | |
| 2019/0067848 A1 | 2/2019 | Aoki | |
| 2019/0088607 A1 | 3/2019 | Wang et al. | |
| 2019/0155779 A1* | 5/2019 | Dropps | G06F 13/4282 |
| 2019/0319626 A1 | 10/2019 | Dabral | |
| 2020/0177187 A1* | 6/2020 | Zhu | H03K 19/17772 |
| 2020/0294180 A1 | 9/2020 | Koker | |
| 2020/0395051 A1* | 12/2020 | Gupta | H05K 1/0228 |
| 2020/0403909 A1* | 12/2020 | Kleyman | G06F 13/30 |
| 2021/0296241 A1 | 9/2021 | Sain | |
| 2021/0343690 A1 | 11/2021 | Salmon | |
| 2023/0280907 A1* | 9/2023 | Knowles | G06F 3/0673 |
| | | | 711/105 |
| 2023/0281136 A1* | 9/2023 | Felix | G06F 13/409 |
| | | | 710/110 |
| 2023/0283547 A1* | 9/2023 | Knowles | H04L 45/60 |
| | | | 709/238 |

OTHER PUBLICATIONS

Vivet Pascal et al, "IntAct: A 96-Core Processor with Six Chiplets 2D-Stacked on an Active Interposer with Distributed Interconnects and Integrated Power Management", IEEE Journal of Solid-State Circuits, IEEE, USA, vol. 56, No. 1, Dec. 10, 2 020 (Dec. 10, 2020), pp. 79-97. Retrieved on Dec. 23, 2020.

Search Report and Written Opinion dated Dec. 14, 2022 for International Application No. PCT/EP2022/079142. 13 pages.

* cited by examiner

MEMORY AND ROUTING MODULE FOR USE IN A COMPUTER SYSTEM

CROSS-REFERENCE TO RELATED APPLICATIONS

The present application claims priority to United Kingdom Patent Application No. GB2202800.5 filed Mar. 1, 2022, United Kingdom Patent Application No. GB2202802.1 filed Mar. 1, 2022, and International Application No. PCT/EP2022/079142 filed Oct. 19, 2022, the disclosures of which are hereby incorporated by reference.

FIELD

The present disclosure relates to a memory and routing module and a system comprising the same.

BACKGROUND

The demand for high performance computing is ever increasing. In particular, efforts are being made to meet the demands of artificial intelligence/machine learning models which impose strenuous requirements on computing resource. It is known to address certain requirements by interconnecting a plurality of processing chips in a cluster, the processing chips being configured to operate in a co-operative manner to meet the demands of processing power required to process large AI/ML models.

Another demand which is imposed on high performance compute is the ability to have access to high-capacity memory. Attempts have been made to connect external memory to processing nodes in a cluster to increase the capacity of the memory. Such external memory may be connected by memory busses which provide an access path between the external memory and the processing node. These memory busses may take the form of parallel or serial links. For example, dynamic random access memories (DRAMs) may be mounted on dual in-line memory modules (DIMMs) on server racks. These can provide the scalable memory capacity of the order of terabytes. Such DIMMs may be mounted vertically in a server rack, and many can be stacked together to provide the memory capacity required for the computer.

SUMMARY

The present inventor seeks to address the joint problems by providing a cluster of processing chips which enable access to high-capacity memory, but which also allow the processing chips to communicate with one another to enhance the processing power for a particular task.

The present inventor has recognised certain disadvantages associated with the current nature of cluster connectivity. Silicon chips contain circuits laid out in two dimensions on a die surface, commonly divided into a "core" (such as processor core 2) surrounded by a periphery or "beachfront" 7 (see FIG. 1). The beachfront is used for input-output (IO) circuits, which are placed at the edges of the chip to ease breakout of signals to packaging pins. For example, the beachfront 7 is used to accommodate the inter-processor links 6a, 6b illustrated in FIGS. 2 and 3, and the processor—memory links 8a . . . 8d to external memory.

The area of the beachfront depends on the types and bandwidth of IO requirements. High performance computing chips frequently use near maximum manufacturable die size ("full reticle") of approximately 25.5×32.5 mm and require a beachfront depth of about 2 mm on each of the four edges of the die. With current lithographic technology, a full reticle die yields a die core of ~21.5×~28.5 mm, which is approximately 74% of the total die area. The computing resources of the die are constrained to this core fraction, which has led the inventor to recognise that the cost of the beachfront area is significant. FIG. 1 shows an example of a die with a processor core 2 and all-round beachfront (on all four edges) labelled 7.

The present disclosure may assist in addressing these issues, and any other issues that would be apparent to the skilled reader from the disclosure herein.

According to a first aspect of the disclosure, there is provided a memory and routing module comprising:
 a substrate;
 a connection component attached to the substrate, the connection component comprising a plurality of pins to mate the module to a corresponding connection component on a motherboard;
 a dynamic random access memory, DRAM, chip disposed on the substrate;
 a routing chip attached to the substrate, the routing chip comprising: a memory controller;
 a plurality of connections, including a first group of connections between the memory controller and the DRAM chip and second group of connections with the pins of the connection component, and
 routing logic configured to route data between the second group of connections and the first group of connections.

The DRAM chip may form part of a DRAM chip package comprising a ball grid array, BGA, the BGA connecting the DRAM chip package to the substrate.

The routing chip may comprise a plurality of bumps by which the routing chip is secured directly to the substrate by flip chip securement.

The memory and routing module may comprise a plurality of DRAM chips disposed on the substrate. The routing chip may comprise a plurality of memory controllers. Each memory controller may be connected to a respective DRAM chip of the plurality of DRAM chips via the plurality of connections. The module may comprise four DRAM chips connected to the routing chip.

At least one of the plurality of DRAM chips may be disposed on a first surface of the substrate. At least one of the plurality of DRAM chips is disposed on a second surface of the substrate.

The memory and routing module may comprise a plurality of routing chips and a plurality of DRAM chips disposed on the substrate, each routing chip including a memory controller connected to a respective DRAM chip.

The connection component may be a mezzanine connection component. The connection component may be hermaphroditic. The module may comprise a plurality of connection components. The module may comprise a pair of connection components. The connection component may be a ball grid array-attached connection component.

The routing chip may be attached to a first side of the substrate. The connection component may be attached at a position corresponding to the position of the routing chip on a second side of the substrate. The routing chip may be configured to receive power via the connection component from a power supply component electrically coupled to the connection component, for example on the motherboard. The module may comprise a plurality of vias in the substrate forming electrical pathways to connect the connection component to the routing chip. The module may not comprise a power supply component, such as a point of load power supply. The routing chip may receive power only via the connection component. The plurality of pins may comprise a plurality of routing chip power supply pins. The routing chip power supply pins may be configured to receive power from the power supply component. The power supply pins may be arranged at a position corresponding to the position of the routing chip on the second side of the substrate. In examples comprising a plurality of routing chips, the connection component may comprise a plurality groups of power supply pins, each group configured to receive power from the power supply component and supply the received power to a respective one of the plurality of routing chips. Each group of power supply pins may be arranged at a position corresponding to the position of the respective routing chip on the second side of the substrate.

The DRAM chip may be a low-power double data rate, LPDDR, memory. The memory controller may comprise an LPDDR interface.

The memory controller may be arranged on long edge of a die of the routing chip. The long edge of the die may face the DRAM chip.

The second group of connections may comprise a plurality of processor connections, each configured for attachment to respective processor chips. The routing logic may be configured to route signals from one of the processor connections to another of the processor connections. The processor connections may be Serializer/Deserializer, SERDES, connections.

The plurality of pins may comprise processor connection pins configured to carry the plurality of processor connections. The processor connection pins may comprise transmitting pins and receiving pins. The receiving pins may be disposed so as not to neighbour the transmitting pins. In this context, "neighbour" may refer to pins that are adjacent to a given pin, including in diagonal directions. At least some of the receiving pins may be separated from the transmitting pins by one or more ground pins.

In examples comprising a plurality of routing chips, the plurality of pins may comprise a plurality of groups of processor connection pins, each group configured to carry the plurality of processor connections of one of the plurality of routing chips. Each group of processor connection pins may comprise transmitting pins and receiving pins. The receiving pins in the group may be disposed so as not to neighbour the transmitting pins in the group. At least some of the receiving pins in the group may be separated from the transmitting pins in the group by one or more ground pins. The transmitting pins of one of the plurality of groups of processor connection pins may be disposed so as not to neighbour receiving pins of another of the plurality of groups of processor connection pins. Suitably, the transmitting pins of each group are disposed so as not to neighbour receiving pins of any other group of the plurality of groups.

The plurality of pins may comprise DRAM chip power supply pins, configured to receive power for the DRAM chip. The DRAM chip power supply pins may be arranged along an edge of the connection component. The edge may be an edge of the connection component most proximate to the DRAM chip.

The substrate may be a package substrate comprising a plurality of conductive lines. The first group of connections and second group of connections may be via the plurality of conductive lines.

According to a second aspect of the disclosure, there is provided a system comprising the memory and routing module defined herein and a plurality of processor chips connected to the memory and routing module via the connection component.

The processor chips may not be in direct electrical communication with each other. Each processor chip may be configured to communicate with other processor chips via a routing chip.

The plurality of processor chips may implement time deterministic processing.

The system may comprise a motherboard to which the module is attachable. The motherboard may be configured for the attachment of the plurality of processor chips. The system may comprise a plurality of modules. The motherboard may comprise power supply components for supplying power to the module.

The disclosure extends to a method of routing data using a memory and routing module as defined herein.

Further optional features of the system of the second aspect and corresponding method are defined hereinabove in relation to the module of the first aspect, and may be combined in any combination.

According to a fourth aspect of the disclosure, there is provided a module comprising:

a package substrate for receiving thereon a flip chip-attached semiconductor chip;

a first flip chip-attached semiconductor chip attached to the package substrate;

a first ball grid array-attached packaged semiconductor chip attached to the package substrate; wherein the first flip chip-attached semiconductor chip and the first ball grid array-attached semiconductor chip are in electrical communication with each other; and a connection component attached to the package substrate, the connection component comprising an electrical coupling to couple the package substrate to a corresponding connection component on a motherboard;

wherein the package substrate comprises a plurality of conductive lines to couple the first flip chip-attached semiconductor chip to the first ball grid array-attached semiconductor chip and the connection component attached to the package substrate.

The first ball grid array-attached semiconductor chip may be a dynamic random access memory, DRAM, chip. The DRAM chip may be an LPDDR chip. The module may comprise a plurality of ball grid array-attached semiconductor chips.

The package substrate may be a monolithic package substrate. At least some of the plurality of ball grid array-attached packaged semiconductor chips may be arranged on the monolithic package substrate.

The module may include a plurality of flip chip-attached semiconductor chips attached to the package substrate. The plurality of flip chip-attached semiconductor chips may be in electrical communication with the plurality of ball grid array-attached semiconductor chips. Each flip chip-attached semiconductor chip may be in electrical communication with a subset of the plurality of ball grid array-attached semiconductor chips. Each flip chip-attached semiconductor chip may be in electrical communication with four ball grid array-attached semiconductor chips. The module may comprise four flip chip-attached semiconductor chips.

The first flip chip-attached semiconductor chip may include routing logic configured to route data between the connection component attached to the package substrate and the first ball grid array-attached packaged semiconductor chip.

The conductive lines coupling the first flip chip-attached semiconductor chip to the connection component may comprise a plurality of processor connections. The first flip chip-attached semiconductor chip may include routing logic configured to route data from one of the processor connections to another of the processor connections. The processor connections may comprise serial connections, such as Serializer/Deserializer, SERDES, links.

The first flip chip-attached semiconductor chip may be attached to a first side of the package substrate. The first ball grid array-attached semiconductor chip may be attached to the first side of the package substrate. The first ball grid array-attached semiconductor chip may be attached to a second side of the package substrate.

The module may comprise a second ball grid array-attached semiconductor chip attached to a second side of the package substrate. The package substrate may comprise a plurality of vias forming electrical pathways to electrically connect the second ball grid array-attached semiconductor chip to the first flip chip-attached semiconductor chip At least one of the vias may be disposed under the first flip chip-attached semiconductor chip.

The first flip chip-attached semiconductor chip may be attached to a first side of the package substrate; the connection component may be attached at a position corresponding to the position of the first flip chip-attached semiconductor chip on a second side of the substrate. The first flip chip-attached semiconductor chip may be configured to receive power via the connection component from a power supply component electrically coupled to the connection component. The module may comprise a plurality of vias in the package substrate forming electrical pathways to connect the connection component to the first flip chip-attached semiconductor chip. The module may not comprise a power supply component, such as a point of load power supply. The first flip chip-attached semiconductor chip may receive power only via the connection component.

The first side and the second side of the substrate may be opposing sides of the substrate.

The package substrate may comprise a plurality of layers, suitably formed on a core. At least two of the layers may comprise conductive lines carrying signals between the first flip chip-attached semiconductor chip and the first ball grid array-attached packaged semiconductor chip, and between the first flip chip-attached semiconductor chip and the connection component. The substrate may be a high-density interconnect, HDI, substrate.

The connection component may be a mezzanine connector. The connection component may comprise a plurality of pins. The connection component may be hermaphroditic. The module may comprise a plurality of connection components. The module may comprise a pair of connection components. The connection component may be a ball grid array-attached connection component.

According to fifth aspect of the disclosure, there is provided a system comprising the module defined herein and a plurality of processor chips connected to the module via the connection component.

According to sixth aspect of the disclosure, there is provided a system comprising the module defined herein and a motherboard to which the module is attachable. The motherboard may be configured for the attachment of a processor chip. The system may comprise the processor chip. The system may comprise a plurality of processor chips and a plurality of modules. The motherboard may comprise power supply components for supplying power to the module.

According to seventh aspect of the disclosure, there is provided a method of manufacturing a module comprising:
providing a package substrate;
forming a plurality of conductive lines in the package substrate;
attaching a first semiconductor chip to the package substrate by flip chip attachment;
attaching a ball grid array packaged semiconductor chip to the package substrate; and
attaching a connection component to the package substrate, the connection component comprising an electrical coupling to couple the package substrate to a corresponding connection component on a motherboard;
wherein the plurality of conductive lines electrically connect the first semiconductor chip to the ball grid array packaged semiconductor chip and the connection component.

The method may comprise comprising heating the module to attach the first semiconductor chip before attaching the ball grid array packaged semiconductor chip or the connection component. The method may comprise underfilling the first semiconductor chip.

The method may comprise heating the module to attach the ball grid array packaged semiconductor chip before attaching the connection component, and heating the module to attach the connection component.

The method may comprise: forming a plurality of vias in the package substrate; attaching the first semiconductor chip to a first side of the package substrate; attaching at least one of the ball grid array packaged semiconductor chip or connection component to a second side of the package substrate. At least one of the conductive lines may pass through the vias to connect the first chip to the ball grid array packaged semiconductor chip or the connection component.

The method may comprise forming a plurality of layers on a core of the package substrate, at least two of the layers comprising conductive lines carrying signals between the first semiconductor chip and the ball grid array packaged semiconductor chip and connection component.

Further optional features of the method of the seventh aspect are defined hereinabove in relation to the module of the fourth aspect, and may be combined in any combination.

In addition, features of the modules, systems and methods defined in the first to third aspects may be combined with the modules, systems and methods of the fourth to seventh aspects.

In certain embodiments of the present disclosure, any processor chip may access any memory attached to any of the fabric chips in a computer cluster. The memory access may be through high-speed serial links. Further, any processor may exchange packets with any other processor in the computer, via the routing logic of the fabric chips.

In certain aspects of the disclosure, the inventor has enabled a cluster of processing chips in multiple hierarchies.

In certain aspects of the disclosure each processing chip itself has improved processor core area for a particular size of substrate.

Another demand which is imposed on high performance compute is the ability to have high bandwidth access to high-capacity memory. So-called high bandwidth memories (HBMs) are presently implemented by providing memory within the physical structure of a processing node itself. That is, the memory is provided in close proximity to the processing chip which is implemented on a silicon substrate within a package which forms the processing node. In practice, the HBM is butted up against a processing chip on a silicon substrate to be as physically as close as possible to the processing chip which provides the processing function. High bandwidth has been achieved in this way, but there is a limit on memory capacity based on the physical size of the memory which can be accommodated in this kind of structure. Moreover, such HBMs are expensive to manufacture.

In the field of Artificial Intelligence (AI) and Machine Learning (ML), the mathematical models can be extremely large, requiring very high capacity memories to accommodate them. As model size increases, so does the expense of providing HBM.

Presently, the lack of availability of a high-capacity, high bandwidth memory poses constraints on the size and nature of models which can be utilised in machine learning/artificial intelligence computers. In particular, the knowledge capacity of a model is a function of the capacity of reasonably accessible memory. In some embodiments of the disclosure, parts of the beachfront are no longer used for connections to external memories, and may be made available to HBM.

BRIEF DESCRIPTION OF THE DRAWINGS

For a better understanding of the present disclosure and to show how the same may be carried into effect, reference will now be made by way of example only to the accompanying drawings.

FIG. 11b is a lower perspective view of the example memory and routing module of FIG. 11a.

Figure 1:
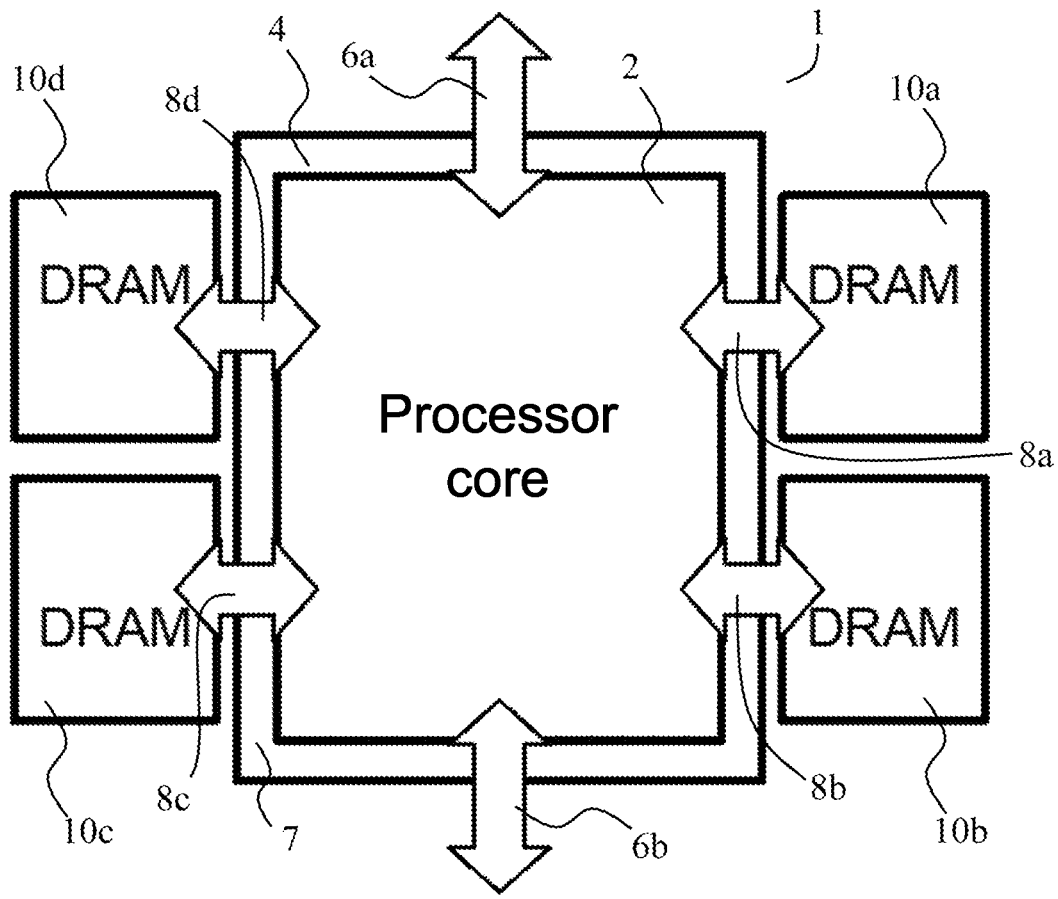
FIG. 1 is a schematic block diagram of a chip connected to memory.

In the drawings, corresponding reference characters indicate corresponding components. The skilled person will appreciate that elements in the figures are illustrated for simplicity and clarity and have not necessarily been drawn to scale. For example, the dimensions of some of the elements in the figures may be exaggerated relative to other elements to help to improve understanding of various example embodiments. Also, common but well-understood elements that are useful or necessary in a commercially feasible embodiment are often not depicted in order to facilitate a less obstructed view of these various example embodiments.

DETAILED DESCRIPTION OF EXAMPLES

There are various known ways of forming a cluster of processing chips by interconnecting the processing chips to each other.

FIG. 1 illustrates an example of a processor chip intended to be connected in a processing cluster. The processing chip 1 comprises a processor core 2 (shown in cross hatched) implemented in a silicon die 4. It is convenient to distinguish between a beachfront area on which external links are provided and a core area for processing circuitry of the processor core. The beachfront area comprises inter-processor links 6a, 6b and processor-memory links 8a, 8b, 8c, 8d, which are shown in FIG. 1 connected to respective DRAMs 10a, 10b, 10c, 10d.

Figure 2:
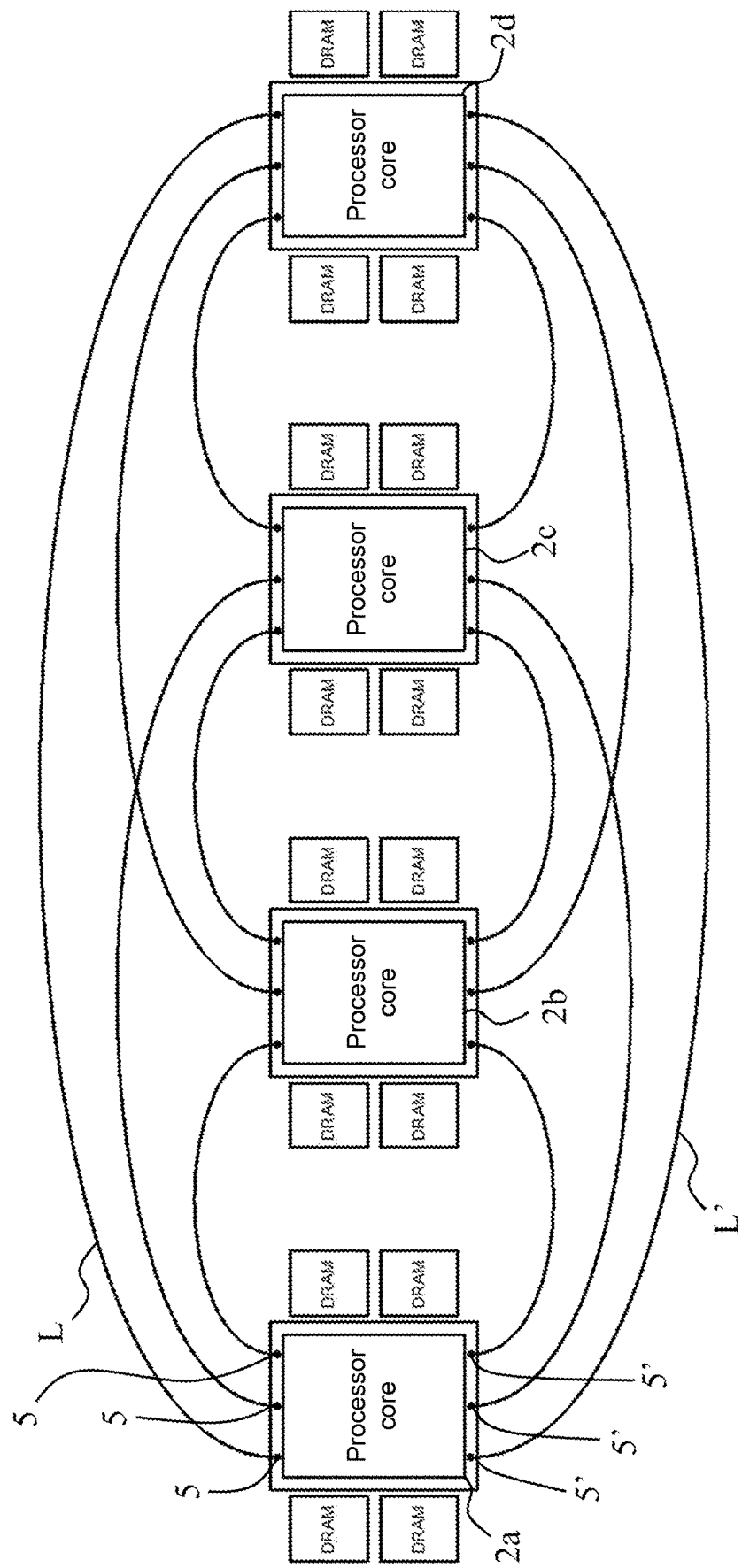
FIG. 2 is a schematic diagram of multiple interconnected chips.

FIG. 2 illustrates a cluster of four processing units of the type illustrated in FIG. 1 with all-to-all direct connectivity of inter-processor links. Each processor core 2a, 2b, 2c, 2d is shown having three external connectors 5 along an upper edge and three external connectors 5' along a lower edge. In the cluster of FIG. 2, each processor core is connected to each other processor core by two external connecting links attached to the external connectors in an illustrated manner. See for example links L and L' connecting processor core 2a to processor core 2d. Note that there remains the need for dedicated processor chip—memory busses to attach the DRAMs.

This is just one example of inter-processor connectivity in a cluster.

Figure 3:
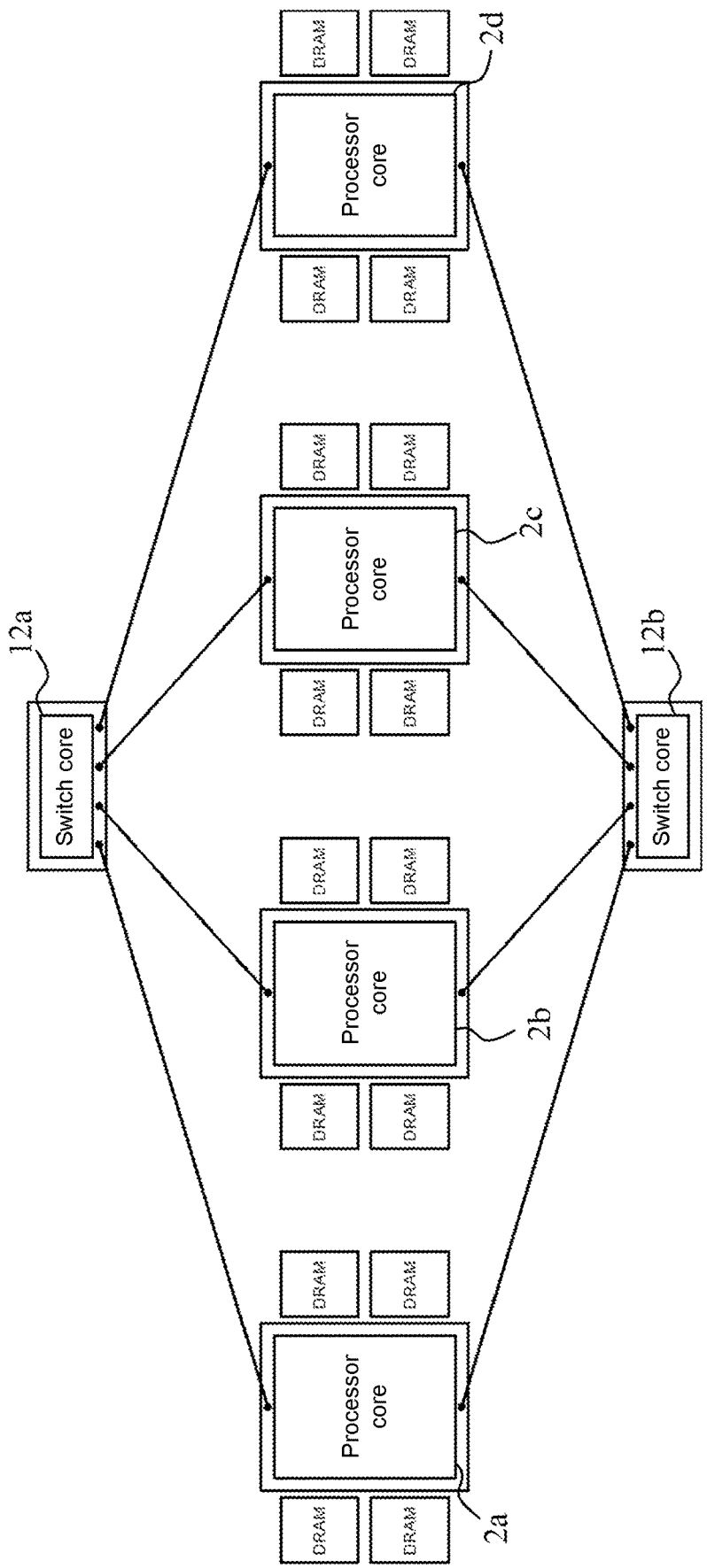
FIG. 3 is a block diagram of multiple processor chips connected using switch cores.

An alternative way of connecting processor chips together in a cluster is to use switch fabrics. FIG. 3 is a schematic diagram illustrating the connection of four processor cores 2a, 2b, 2c, 2d to each of two respective switch cores 12a, 12b. Each switch core can be caused to route traffic between particular processor cores, under program control. In this arrangement, each processor has access to its own externally connected DRAM.

In the above-described examples, each processing chip had access to memory. In some previous examples, that memory may be externally connected memory connected to each processor core of the cluster and/or high bandwidth memory (HBM) connected within a processor package. In either case, the attachment of memory uses 'beachfront' of the die.

In certain embodiments of the present disclosure, a computer comprises a plurality of processor chips and fabric chips, arranged in clusters. Within a cluster, each processor chip is connected to all of the fabric chips, and each fabric chip is connected to all of the processor chips in an all-to-all bipartite connected configuration. There are no direct connections between the fabric chips themselves in a cluster. Further, there are no direct connections between the processor chips themselves. Each fabric chip has routing logic which is configured to route incoming packets from one processor chip to another processor chip which is connected to the fabric chip. Furthermore, each fabric chip has means for attaching to external memory. The routing logic is capable of routing packets between a processor connected to the fabric chip and memory which is attached to the fabric chip. The fabric chip itself comprises a memory controller which performs memory control functions for governing memory accesses from and to memory attached to the fabric chip.

In certain embodiments, further described herein, clusters of processing chips and fabric chips may themselves be interconnected to form a larger computer system. Each processor chip within a cluster may access any of the memory attached to any of the fabric chips within the cluster. This significantly enhances the memory capacity which is rendered available to any particular processor chip.

The connection configuration described herein has the further merit that in certain embodiments, it is not necessary to use all of the edges of a processor die for surfacing external connections.

Figure 4:
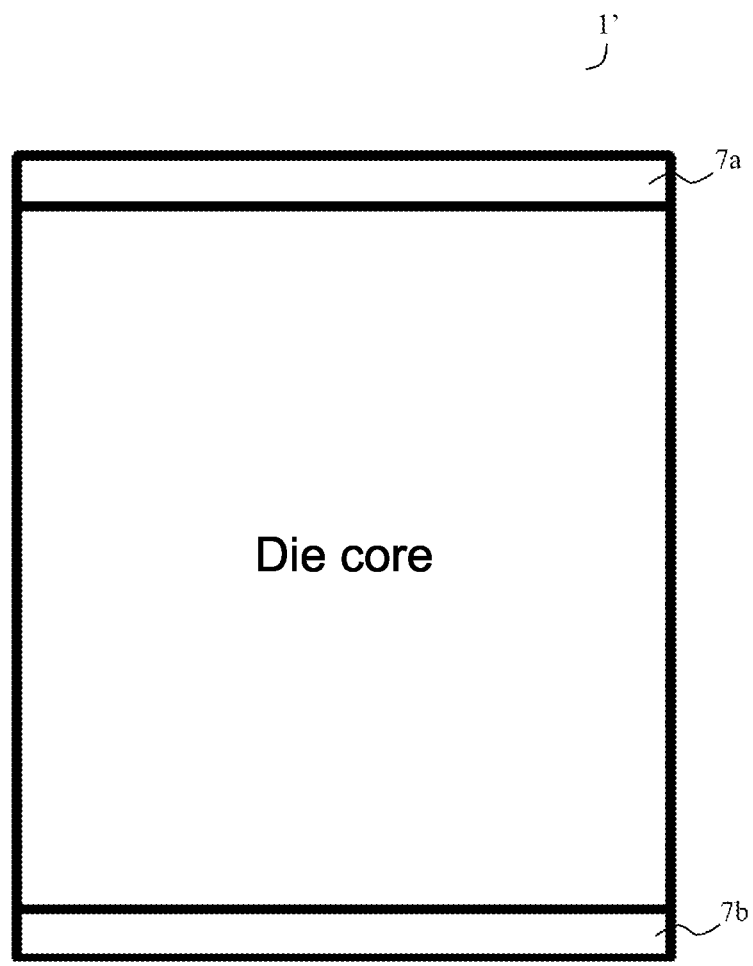
FIG. 4 is a schematic block diagram of a processor chip with reduced beachfront.

The present inventor has recognised that it is advantageous to limit the beachfront required for connectivity to fewer than all of the four edges of the die, thus, releasing more of the silicon for the manufacture of processing "core". For example, if only the short edges of a full reticle die are used for IO, then the area available for processor core on the chip increases to about 88% of the total die area, which is about 19% more than in the four sides case. FIG. 4 illustrates an example of such a chip 1' in which the longitudinal edges do not accommodate beachfront, but where the upper and lower edges each have a beachfront 7a, 7b.

The connectivity requirements of prior art processing clusters involve an all-round beachfront (such as shown in FIG. 1). Certain implementations of the present connected configurations described herein enable use of a processor die with beachfront only on the upper and lower edges, and with no beachfront on the longitudinal edges (as shown in FIG. 4).

Figure 5:
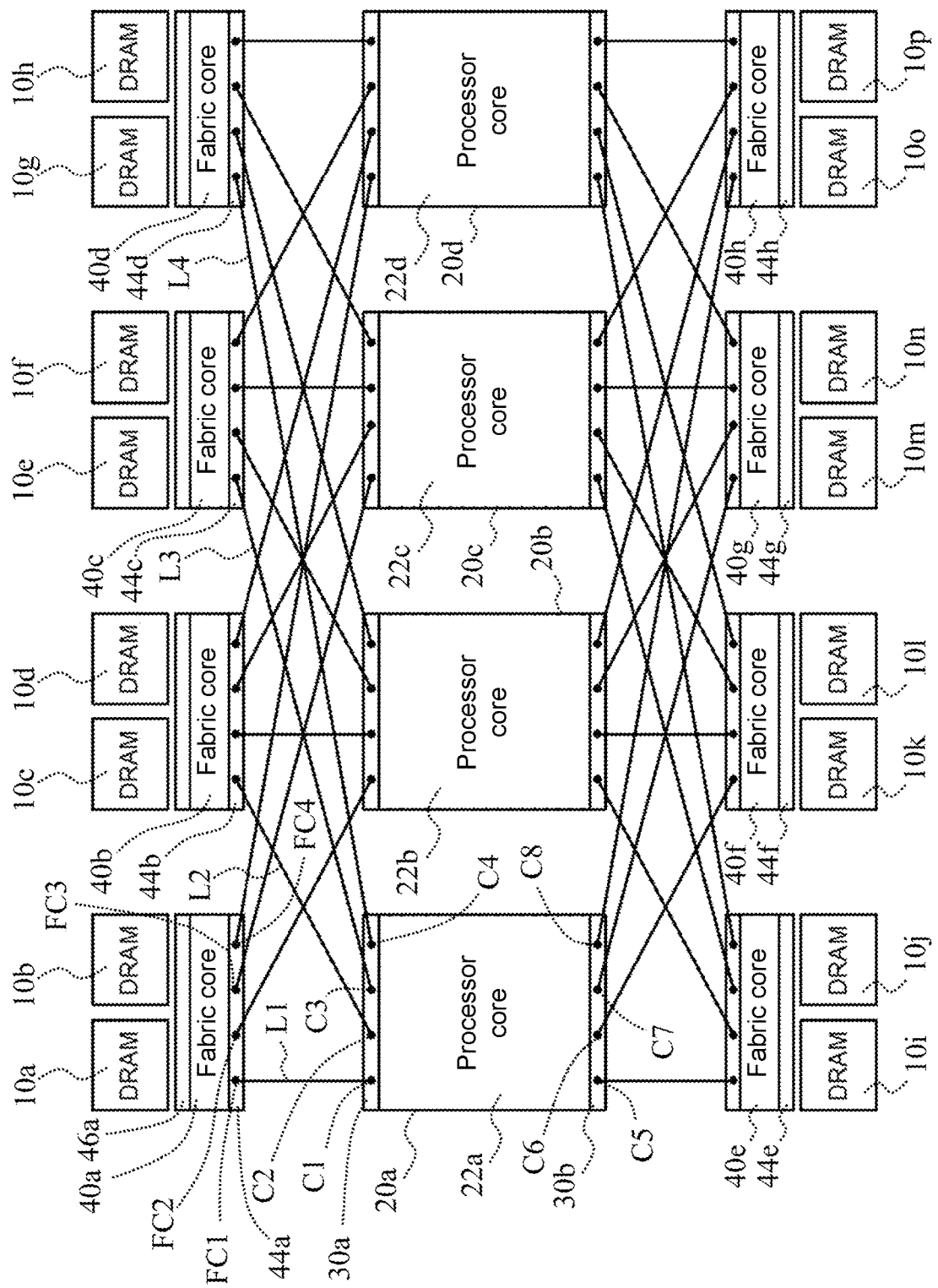
FIG. 5 is a schematic block diagram of a computer comprising interconnected processor chips and fabric chips.

In accordance with the presently described example of the present disclosure, multiple processors are connected in a cluster using one or more "fabric chips". Each fabric chip provides access to external memory (e.g. DRAM) and also provides routing of inter-processor traffic. Reference is made to FIG. 5. FIG. 5 illustrates four processor chips 20a, 20b, 20c, 20d. Each processor chip comprises a processor core area 22a, 22b, 22c, 22d which extends to each longitudinal edge of the chip. Each processor chip has an upper beachfront area 30a and a lower beachfront area 30b (shown for chip 20a only). The upper beachfront area 30a has a set of external port connections C1, C2, C3, C4 (labelled only on processor chip 20a). It will be evident that each processor chip also has four external port connections on the upper beach front area. The lower beachfront area of each processor chip similarly has four external port connections labelled C5, C6, C7, C8. Note that the lower set of external port connections is a labelled only on the processor chip 20a. It is evident that the other processor chips similarly each have a set of external port connections on their lower beachfront areas.

The cluster of FIG. 5 further comprises eight "fabric chips". Each fabric chip comprises a fabric core 40a, 40b . . . 40h. Each fabric chip has a lower beachfront area 44a . . . 44h which has a set of external ports. These external ports are provided in port connections labelled on fabric chip 40a only as FC1, FC2, FC3, FC4. It is apparent that each fabric chip has a corresponding set of external ports on each lower beachfront area. The upper beachfront area of each fabric chip is provided with one or more memory attachment interface which enables the fabric chip to connect to one or more memory, illustrated in FIG. 5 as respective DRAMs 10a, 10b, 10c, 10d . . . to 10p. For example, the fabric core 40a shown in FIG. 5 is connected to two DRAMS 10a, 10 by suitable memory attachment interfaces provided on the upper beachfront 46a of the fabric chip. Other high capacity memories may be connected, for example Double Data Rate DRAMs (DDRs) and later manifestations thereof such as Low Power DDRs (LPDDRs). The high bandwidth connectivity between processor chips and fabric chips within a cluster is "all-to-all bipartite". This means that each processor chip is connected to every fabric chip, and each fabric chip is connected to every processor chip. Connections are via links such as L1 between a processor port in a port connection, such as C1, and a fabric chip port in a port connection, such as FC1. Note, however, that in the example shown there are no direct high bandwidth connections between processor chips, or between fabric chips within the cluster. Moreover, in the example shown there is no externally attached memory directly connected to each processor (although there may be High Bandwidth Memory within a chip package—see later). Each fabric chip provides a routing function which provides pathways between every pair of processors, and between each processor and the memory attached to the fabric chip.

Furthermore, the links could be manifest in any suitable way. Each link can be connected or reconnected to different ports to set up a computer configuration. Once a computer configuration has been set up and is in operation, the links are not multiplexable and do not fan in or fan out. That is, there are no intermediate switches instead a port on a processor is directly connected to an end port on the fabric chip. Any packet transmitted over a link will be received at the port at the other end of the fixed link. It is advantageous that the links are bi-directional and preferable that they can operate in both directions at once, although this is not an essential requirement. One particular category of communication link is a SERDES link which has a power requirement which is independent of the amount of data that is carried over the link, or the time spent carrying that data. SERDES is an acronym for Serializer/DeSerializer and such links are known. For example, a twisted pair of wires may be used to implement a SERDES link. In order to transmit a signal on a wire of such links, power is required to be applied to the wire to change the voltage in order to generate the signal. A SERDES link has the characteristic that there is a fixed power for a bandwidth capacity on a SERDES link whether it is used or not. This is due to the need to provide clocking information on the link by constantly switching the current or voltage state of the wire(s) even when no data is being transmitted. As is known, data is transmitted by holding the state of the wire(s) to indicate a logic '0' or logic '1'. A SERDES link is implemented at each end by circuitry which connects a link layer device to a physical link such as copper wires. This circuitry is sometimes referred to as PHY (physical layer). In the present example, packets are transmitted over the links using Layer 1 and Layer 2 of an Ethernet protocol. However, it will be appreciated that any data transmission protocols could be used.

There are several advantages to the computer described herein.

It is no longer necessary to dedicate a fixed proportion of processor beachfront (and therefore IO bandwidth) to fixed capacity memory or to inter-processor connectivity. All processor IO bandwidth passes via the fabric chips, where it can be used on-demand for either purpose (memory or inter-processor).

Under some popular models of multiprocessor computation, such as bulk synchronous parallel (BSP), the usage of peak DRAM bandwidth and peak inter-processor bandwidth might not be simultaneous. The total bandwidth requirement may therefore be satisfied with less processor beachfront, providing the processor chips with more core area. BSP in itself is known in the art. According to BSP, each processing node performs a compute phase and an exchange phase (sometimes called communication or message passing phase) in an alternating cycle. The compute phase and exchange phase are performed by the processing chips executing instructions. During the compute phase, each processing unit performs one or more computation tasks locally, but does not communicate any results of these computations to the other processing chips in the cluster. In the exchange phase, each processing chip is allowed to exchange one or more results of the processing from the preceding compute phase to and/from one or more others of the processing chips in the cluster. Note that different processing chips may be assigned to different groups for synchronisation purposes. According to the BSP principle, a barrier synchronisation is placed at the juncture transitioning from the compute phase into the exchange phase, or the juncture transitioning from the exchange phase into the compute phase, or both. That is, to say either all processing chips are required to complete their respective compute phase before any in the group is allowed to proceed to the next exchange phase, or all processing chips in the group are required to complete their respective exchange phase before any processing chip in the group is allowed to proceed to the next compute phase, or both of these conditions are enforced. This sequence of exchange and compute phase is repeated over multiple cycles. In BSP terminology, each repetition cycle of exchange phase and compute phase may be referred to as a "superstep".

This has the practical effect that there are circumstances when there is no simultaneous usage of all links required for accessing memory (for the purpose of completing a compute phase) and links used to exchange data between the processing chips in an exchange phase. As a consequence, there is maximum efficient use of the fixed links, without compromising memory access times or inter-processor exchange delays. It will nevertheless be appreciated that embodiments described herein have applications other than when used with BSP or other similar synchronisation protocols.

It is possible that the links could be dynamically deactivated to consume effectively no power while not in use. However, the activation time and non-deterministic nature of machine learning applications generally render dynamic activation during program execution as problematic. As a consequence, the present inventor has determined that it may be better to make use of the fact that the link power consumption is essentially constant for any particular configuration, and that therefore the best optimisation is to maximise the use of the physical links by maintaining concurrent inter processor and processor-memory activity as far as is possible.

All of the memory in the cluster is accessible to each processor without indirection via another processor. This shared memory arrangement can benefit software efficiency.

In the example shown in FIG. 5, there are two "ranks" of fabric chips, each attached to a respective upper and lower edge of the processor chip. The upper rank comprises fabric cores $40a \ldots 40d$, connected by respective links to each of the processor cores. For example, the processor core $20a$ is connected to fabric core $40a$ by link L1, fabric core $40b$ by link L2, fabric core $40c$ by link L3 and fabric core $40d$ by link L4. The lower rank comprises fabric cores $40e \ldots 40h$. The fabric core $40a$ is also connected to each of the processor cores $20a \ldots 20d$, by corresponding links (which are shown but not labelled in the Figure for reasons of clarity). There is no use of the longitudinal processing chip edge for beachfront.

However, there are different design choices within the overall concept. For example, the long edges of the processors could be used to provide more bandwidth to the fabric chips, and all the links emerging from the beachfront of the processor chips could be passed to a single rank of fabric chips, or to three ranks etc.

The number of fabric chips in each rank may differ from the number of processor chips. What remains important to achieve the advantages of the disclosure is that the all-to-all bipartite connectivity between the processing chips and the fabric chips is maintained, with the routing functionality and external memory access provided by the fabric chips.

Figure 6:
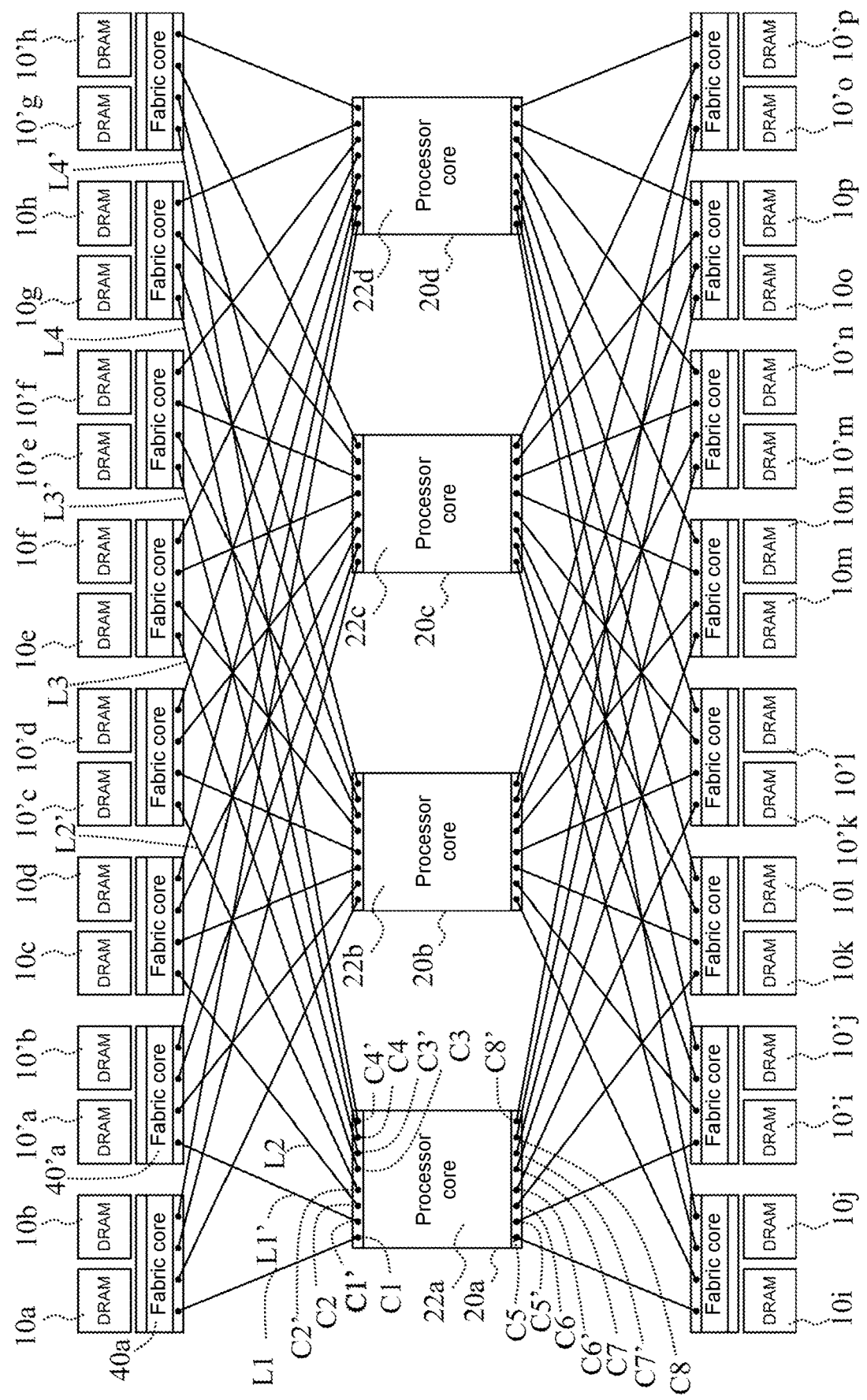
FIG. 6 is a schematic block diagram of a computer comprising interconnected processor chips and fabric chips, with a higher ratio of fabric chips to processor chips.

FIG. 6 shows a particular example in which four processing chips are connected to an upper rank of eight fabric chips and a lower rank of eight fabric chips. Each processing chip is connected to sixteen fabric chips. Take for example the processor chip $20a$. This has eight upper link connectors C1, C1', C2, C2', C3, C3', C4, C4', each one connected to a respective link connector on a respective fabric core, two of which are labelled in FIG. 6 as $40a$, $40a'$. The processor chip has eight lower link connectors C5, C5', C6, C6', C7, C7', C8, C8' connected to respective link connectors on each of eight fabric chips in the lower rank. Each fabric chip is connected to four processor chips.

Note that the use of the external connectors to provide the all-to-all bipartite connectivity in the cluster according to examples of the present disclosure does not rule out the presence of other I/O ports on the processor chips or the fabric chips. For example, certain ones of the processor chips or fabric chips in the cluster may be provided with an I/O port enabling connectivity between multiple clusters or to host devices etc. In one embodiment described with reference to FIGS. 8 and 9, the fabric chips provide this additional connectivity.

Figure 7:
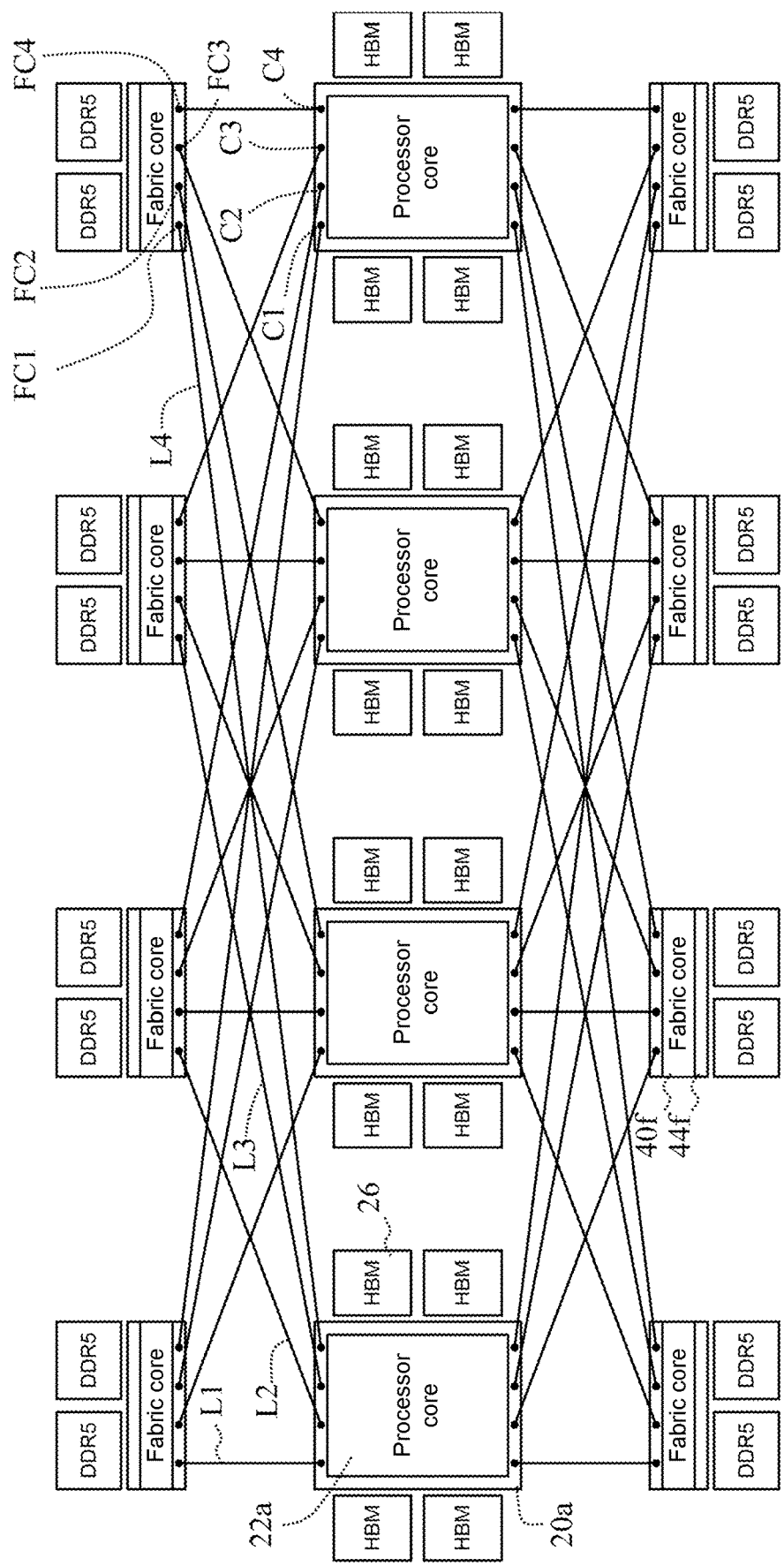
FIG. 7 is a schematic block diagram of a computer comprising interconnected processor chips and fabric chips, each processor chip associated with high bandwidth memory.

Furthermore, note that additional memory may be attached directly to the processor chips, for example along the longitudinal edges. That is, additional High Bandwidth Memory (HBM) may be provided in close proximity to the processing chip which is implemented on a silicon substrate within a package which forms a processing node. In practice, the HBM is butted up against a processing chip on a silicon substrate to be as physically as close as possible to the processing chip which provides the processing function. For example, high bandwidth memory (HBM) could be attached to the processor chips, while high-capacity memory could be attached to the fabric chips—thus, combining the advantages of both memory types in the cluster. FIG. 7 illustrates an embodiment in which high bandwidth memory (HBM) modules 26 are attached to the east and west edges of each processor chip $20'a$, $20'b$, $20'c$, $20'd$. In other respects, the computer illustrated in FIG. 7 has the same connectivity as that described in FIG. 5. Attachment of HBM 26 may be by short parallel connections of a memory bus formed in a substrate, or using a silicon bridge in a package substrate.

In the examples of the computers described herein, the processor chips 20 are not intended to be deployed on a standalone basis. Instead, their deployment is within a computer cluster in which the processor chips are supported by one or more fabric chip 40. The processor chips 20 connect to one another through the fabric chips 40, enabling use of all of the processor chip links L1, L2 etc. for use simultaneously as processor-to-processor links and memory access links. In this way, the computer offers a higher capacity fast memory system when compared against existing computer systems. In current computer systems, it will become increasingly expensive to provide high capacity, high bandwidth memory. Furthermore, there remain limits on the processing power which can be obtained while delivering high bandwidth memory access and high-capacity memory. The present computer may enable those limits to be exceeded.

By providing routing logic on the fabric chip, it is not necessary for the processor chip to have routing logic for the purposes of external routing functions. This allows silicon area to be freed up to maximise the per processor chip I/O bandwidth and also to maximise area available for processing circuitry within the processor core.

By locating link ports along the north and south edges, this releases the east/west edges. This either allows the processor core to extend into the east/west edges, thereby maximining the processing capability, or allows the east/west edges to be kept free for high bandwidth memory integration.

The computer may be operated in different topologies. In one example, a group of four processor chips and eight fabric chips (as illustrated for example in FIG. 5) may constitute a cluster. Within a cluster, each group of four fabric chips connected to one of the processor chip edges is referred to herein as a rank. The cluster of FIG. 5 contains two ranks.

A pod may comprise multiple clusters. Clusters may be interconnected within a pod using a processor facing link on the fabric chip. Pods may be interconnected to each other using a pod facing link on the fabric chip. These are shown in more detail in FIG. 9 which illustrates the fabric chip.

Figure 8:
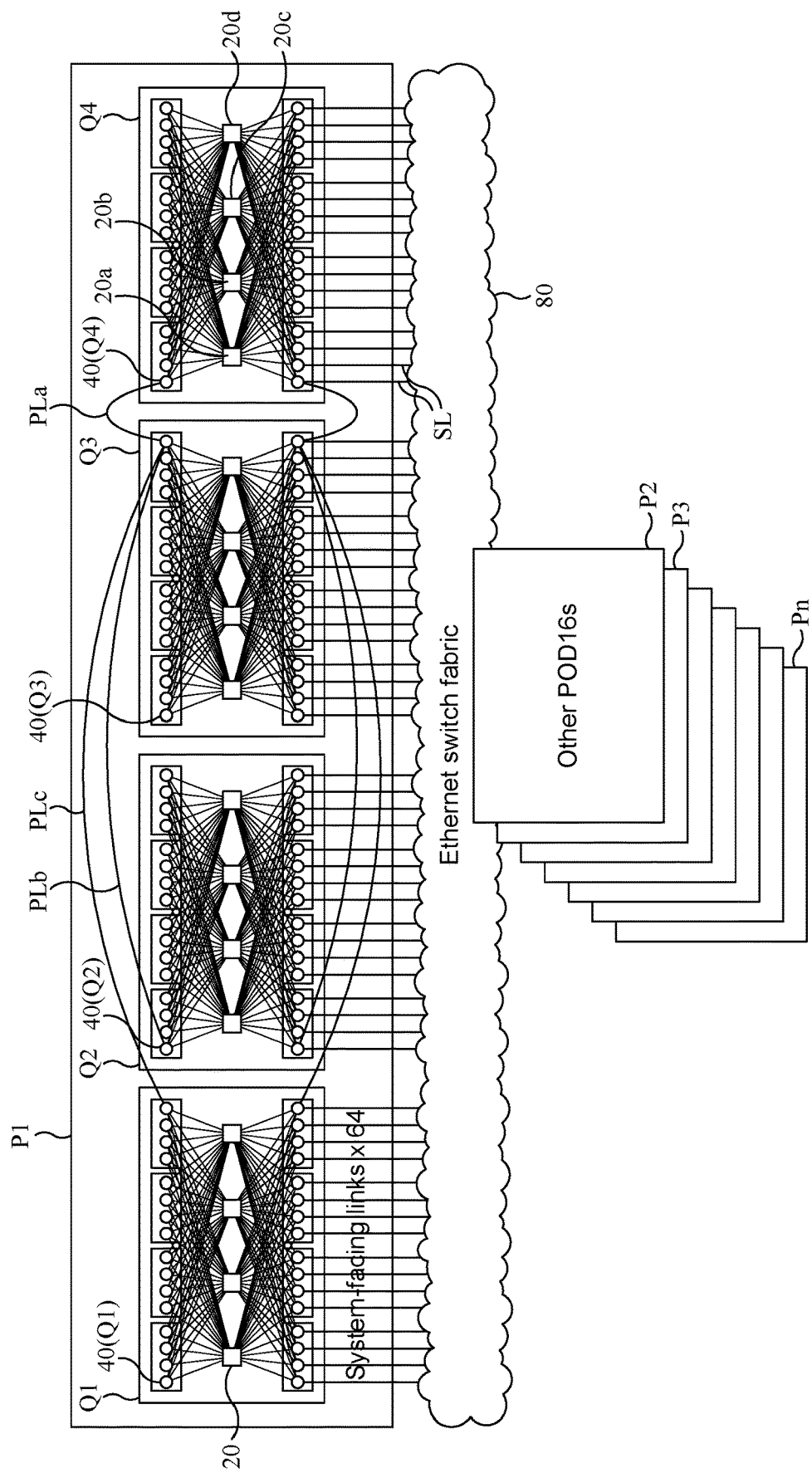
FIG. 8 is a schematic block diagram of a computer comprising a set of interconnected clusters.
Figure 9:
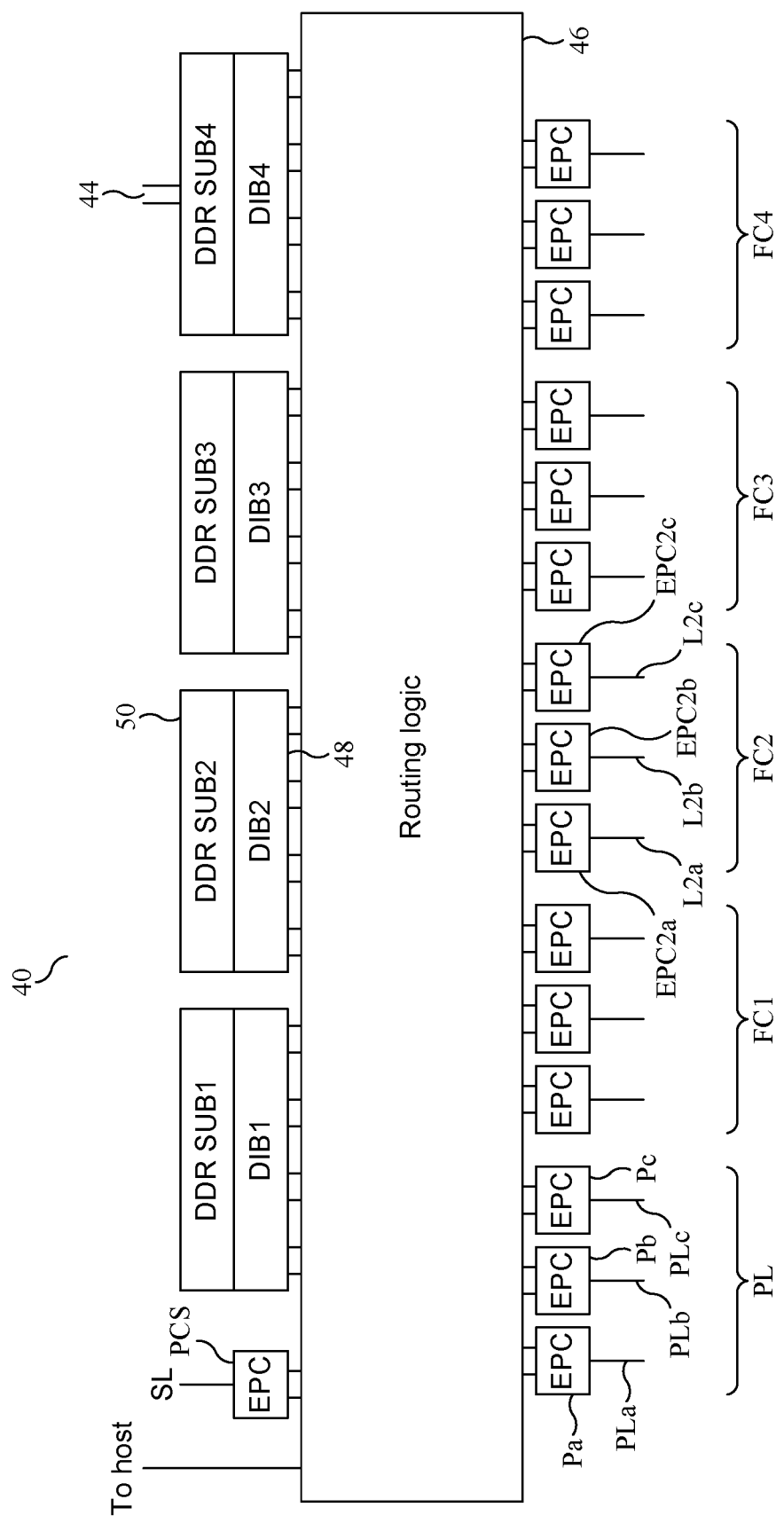
FIG. 9 is a schematic block diagram of a fabric chip.

FIG. 8 is a schematic overview of a system topology and hierarchy according to one embodiment. FIG. 8 illustrates multiple pods P1, P2, P3 . . . Pn (labelled POD 16). In the example of FIG. 8, n=8, but it will readily be appreciated that different numbers of pods may be connected into a computer system using the techniques described herein. One of the pods P1 is shown in detail. The pod P1 comprises four clusters Q1, Q2, Q3, Q4. In the example of FIG. 8, each cluster comprises four processor chips 20a, 20b, 20c, 20d sharing thirty-two fabric chips. Fabric chips 40 are labelled in FIG. 8, Q4 for example denoting that that fabric chip 40 (Q4) is in the cluster Q4. As shown in FIG. 8, in each cluster Q1, Q2, Q3, Q4, four processor chips 20a, 20b, 20c, 20d are connected to thirty two fabric chips in an all-to-all bipartite arrangement. That is, as described above, each fabric chip in the cluster is connected to all four processor chips, and each processor chip is connected to all thirty two fabric chips. Each processor chip has thirty two port connections C1, C2 . . . C32, sixteen on the upper edge and sixteen on the lower edge. As illustrated in FIG. 9, in certain embodiments, each port connection provides three bi-directional serial links, making a total of ninety-six processor links. Each set of twelve of a processor's external links (out of ninety-six links) connects to a respective set of four of the fabric chips (three processor links to each fabric chip port connection FC). Eight sets of twelve links thus connect to eight sets of four fabric chips within a cluster. The four clusters Q1, Q2, Q3, Q4 are grouped to form a pod, using pod facing links of the thirty-two fabric chips within each cluster. Each cluster exports three bundles each of 32 links, with each bundle connecting to each of the other three clusters. A bundle of pod facing links between two clusters includes one link between each of the thirty two corresponding peer fabric chips in the two clusters. Certain of the pod facing links may be connected to third party ethernet switches.

FIG. 9 is a schematic block diagram of components on a fabric chip 40. As shown in FIG. 9, routing logic 46 is connected to the DDR interface blocks 48 for transferring data packets between DDR interface block 48 and the other ports. The routing logic 46 is further attached to each processor connected link port. Each port comprises an ethernet port controller EPC. The routing logic is attached to ethernet port controllers of the pod facing ports, and to an ethernet port controller of a system facing link. The routing logic 46 is further attached to a PCI complex for interfacing with a host system. PCIe (Peripheral Component Interconnect Express) is an interface standard for connecting high speed computers.

FIG. 9 illustrates an example of a fabric chip which, in addition to enabling inter-processor communication, and processor-to-memory communication, enables a computer to be constructed by connecting together computer clusters in a hierarchical fashion. Firstly, the components of the fabric chip which are used for implementing the inter-processor communication, and the processor-to-memory communication will be described. Each fabric core port connection comprises three serial links. Each serial link comprises a port with an ethernet port controller (EPC). As mentioned, these links may be SERDES links, for example, twisted wire pairs enabling serial packet communication.

For reasons of clarity, not all of the components in FIG. 9 are illustrated with associated references. Each of the fabric core connections FC1, FC2, FC3 and FC4 have a configuration as now herein described with reference to fabric core port connection FC2 which connects to the second processor (for example processor 20b in FIG. 6). The fabric connection FC2 comprises three links L2a, L2b, L2c, each comprising an ethernet port controller EPC2a, EPC2b, EPC2c respectively. Note that in other embodiments, a single physical link may be provided, or a different number of physical links may be provided in each fabric chip connection FC. Note that the link labelled L2 in previous Figures may therefore comprise three individual serial links (such as L2a, L2a and L2c). Routing logic 46 in the fabric chip 40 may be implemented as a ring router, cross bar router or in any other way. The fabric chip is further connected to external memories (such as DRAMS 10A, 10B etc.) (not shown in FIG. 9). Although two DRAMS are shown in the previous Figures, in the embodiment of FIG. 9, the fabric chip is connected to four DRAMS. In order to make this connection, the fabric chip comprises four DRAM interface blocks DIB1, DIB2, DIB3 and DIB4, each associated with four DDR sub connection layers DDR sub1, DDR sub2, DDR sub3 and DDR sub4. Each DDR interface block DIB 48 incorporates a memory controller which manages access to the memory which is attached to the block. One memory attachment interface 44 is shown in FIG. 9, but it will be appreciated that each DDR sub layer has a respective memory attachment interface for attaching to external DRAM. The routing logic 46 is configured to route memory access packets received from an attached processor core to the addressed one of the data interface blocks DIB1 to DIB4. The routing logic 46 is further configured to route packets from one attached processor chip to another attached processor chip via the respective fabric chip ports. In certain embodiments, the routing logic prevents a memory packet (such as a memory access response packet) from being routed from one memory attachment interface to another memory attachment interface. A memory response packet in such embodiments may only be routed to a processor chip via the correct port attached to the routing logic 46. For example, incoming packets on link L2a of fabric core port connection FC2 will be routed, based on routing information in the packet, to the addressed port connected to the routing logic 46. For example, if the packet is intended to be routed to the processor 20c, the routing logic 46 will identify the processor 20c from the routing information in the packet and cause the packet to exit through the ethernet port controller onto the link attached to the processor 20c.

Should the packet be a memory access packet, the routing logic routes the packet based on the memory address in the packet to its appropriate DDR interface block. Note that in this embodiment each DDR interface block DIB1 ... DIB4 comprises four memory access channels. It will be appreciated that any number of memory access channels may be provided by each interface block DIB1 ... DIB4. The memory access channels are managed by the memory controller in each data interface block DIB1 ... DIB4.

As explained above, in the example shown in FIG. 9, the fabric chip 40 has additional components which allow a computer to be made up of interconnected clusters. To this end, the fabric chip comprises a pod facing port connection PL. The pod facing port connection PL comprises three ports, each port comprising an ethernet port controller Pa, Pb, Pc connected to a respective link. The routing logic detects packets whose packet information indicates that the packets should not be routed to a processor within this cluster, but should instead be routed to a processor of another cluster, and routes the packet to one of the pod facing ports. Note that the pod facing port connection PL may transmit packets to a corresponding pod facing port in a fabric chip on another cluster, or may receive packets from a corresponding pod facing port on a fabric chip of another cluster.

The fabric chip of FIG. 9 also permits a packet to be routed to another pod within a system. To this end, a system port SL is provided. The system port comprises a corresponding ethernet port controller EPC and is connected to a system's serial link which is connected to a corresponding port in another pod. The routing logic may determine that a packet is intended for routing to another pod in the system and transmit the packet to the system port SL. Packets may be received over the system port SL from a corresponding system port of another fabric chip in another pod in the system which is connected via a system serial link, and be applied to the routing logic.

It will be appreciated that any type of routing logic could be utilised to route traffic from one external connection of the fabric chip to another connection of the fabric chip, either to another processor chip via an external port or to attached memory via a memory attachment interface. The term data packet when used herein denotes a sequence of bits comprising a payload to be transmitted either between processor chips or between a processor chip and memory attached to a fabric chip. The packets include information, such as destination identifiers and/or memory addresses for routing purposes. In some embodiments, a destination processor identifier may be included in a packet header. One type of ring routing logic is described in Graphcore's GB patent application no. GB2115929.8.

Figure 10:
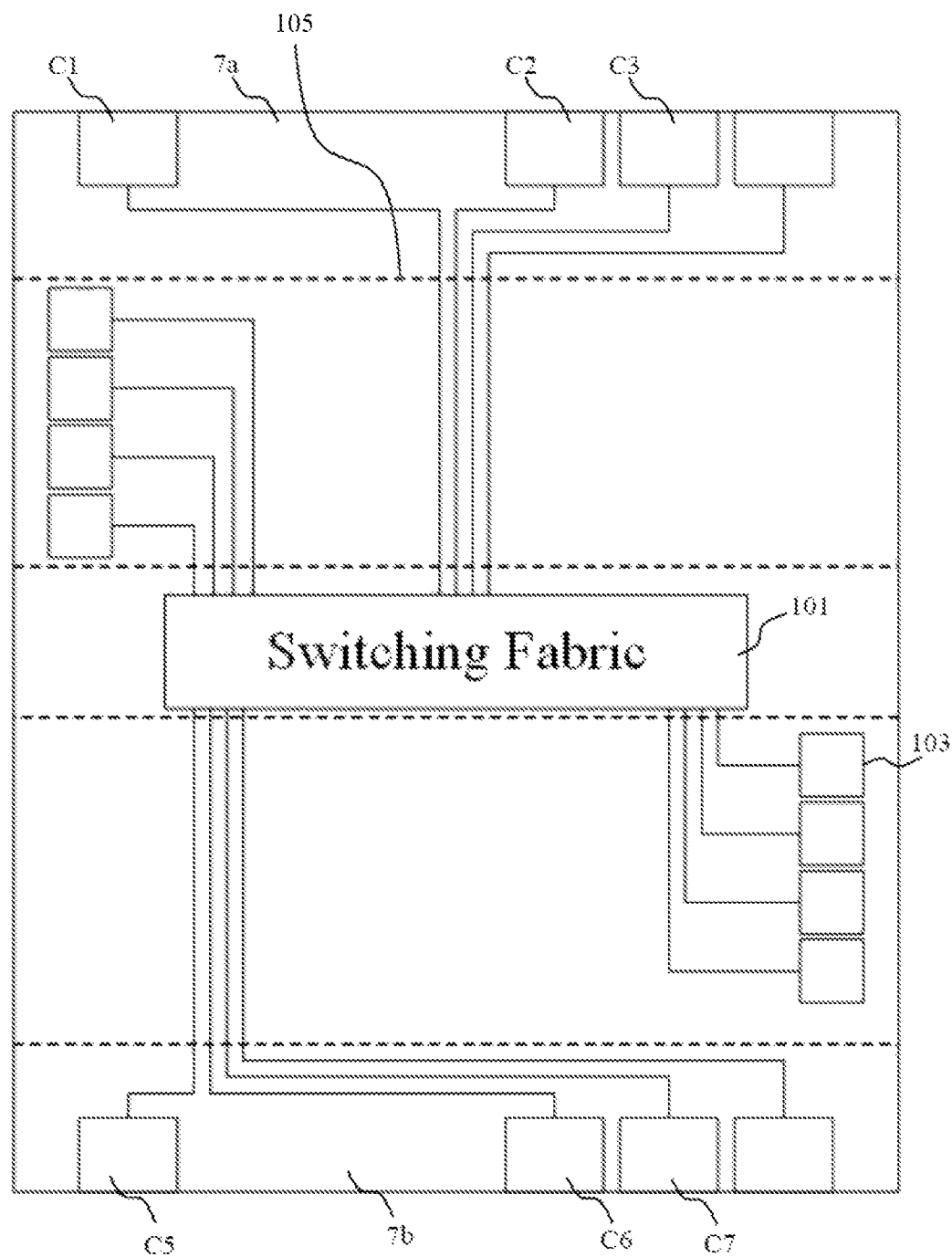
FIG. 10 is a schematic diagram of one example of a processor chip.
Figure 11A:
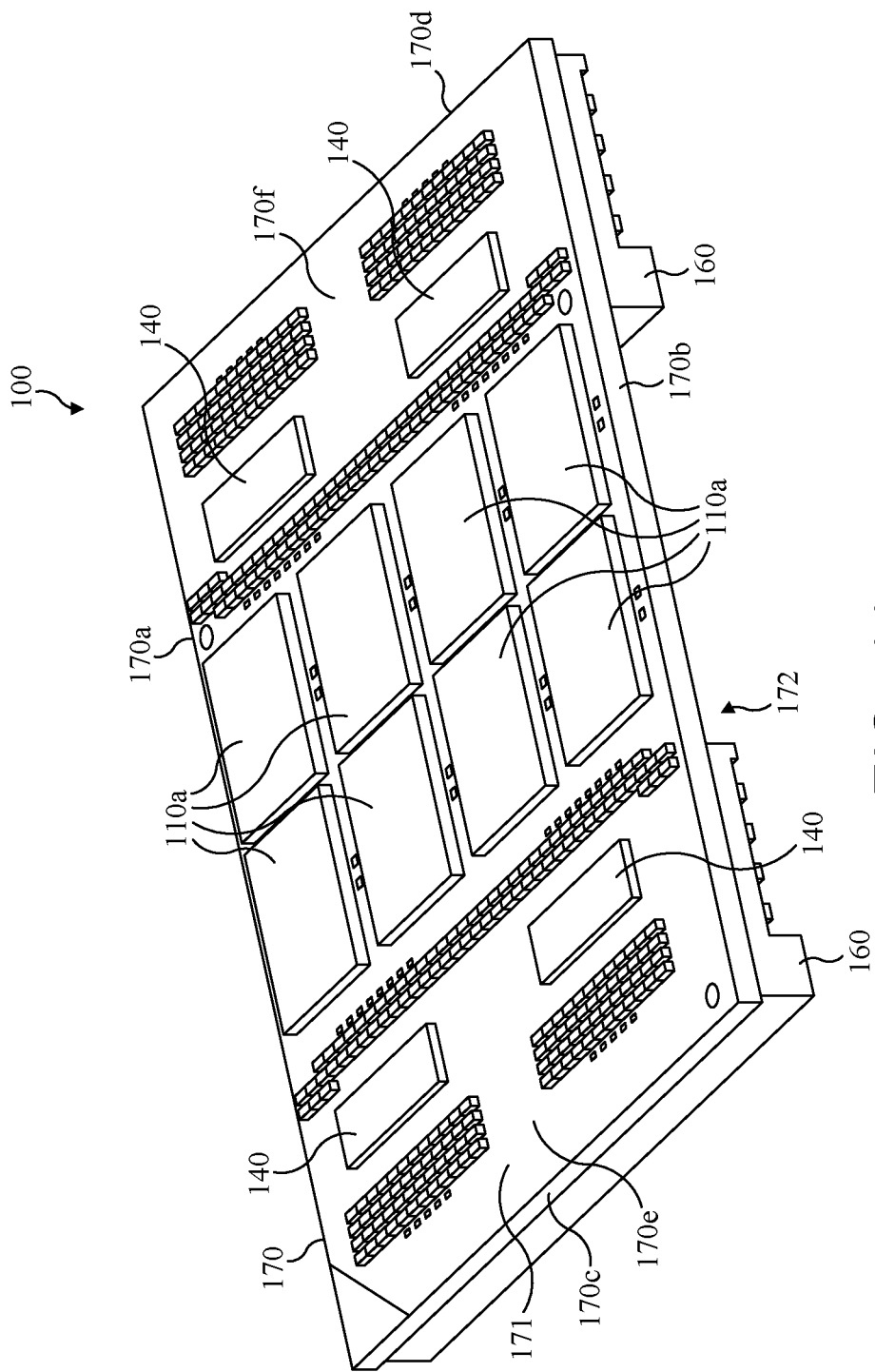
FIG. 11a is an upper perspective view of an example memory and routing module.
Figure 11B:
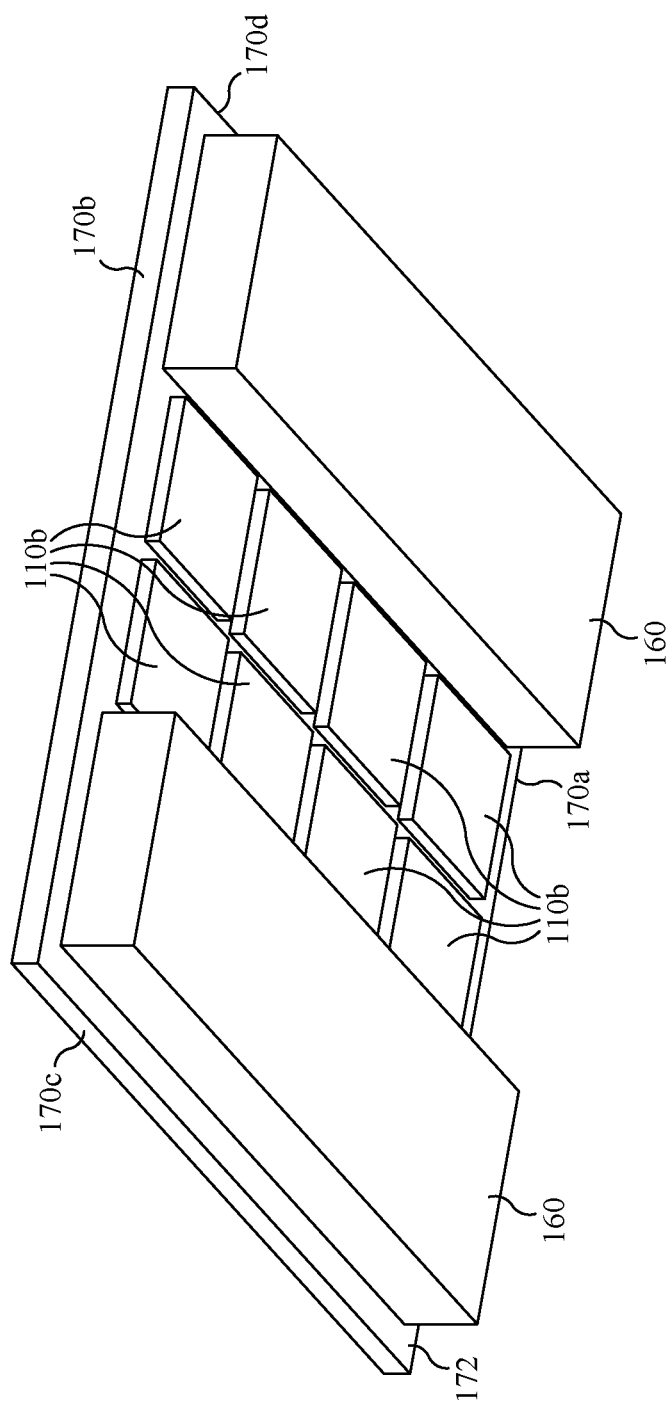
Figure 12:
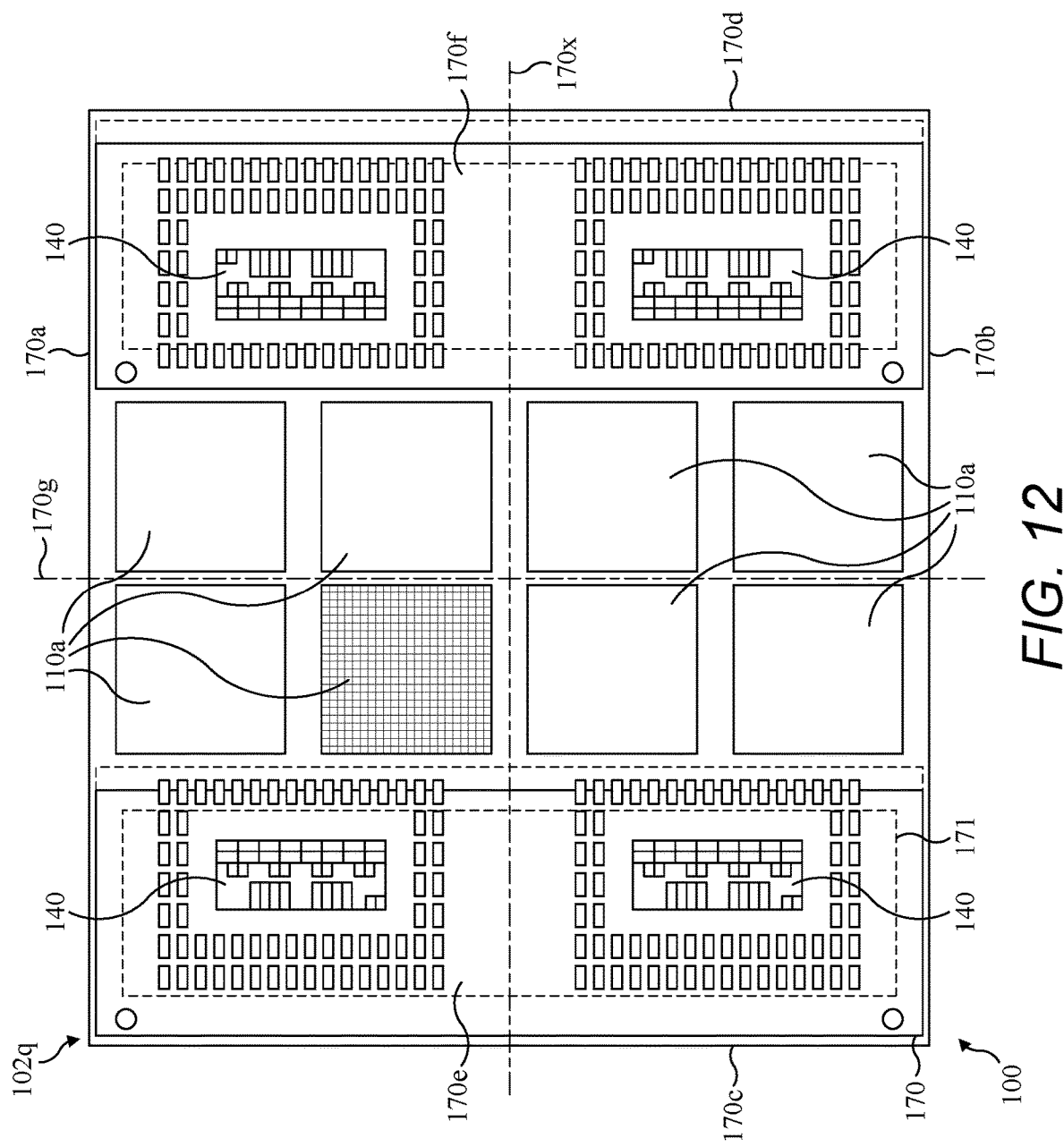
FIG. 12 is a schematic view of an upper surface of the example memory and routing module of FIG. 11.
Figure 13:
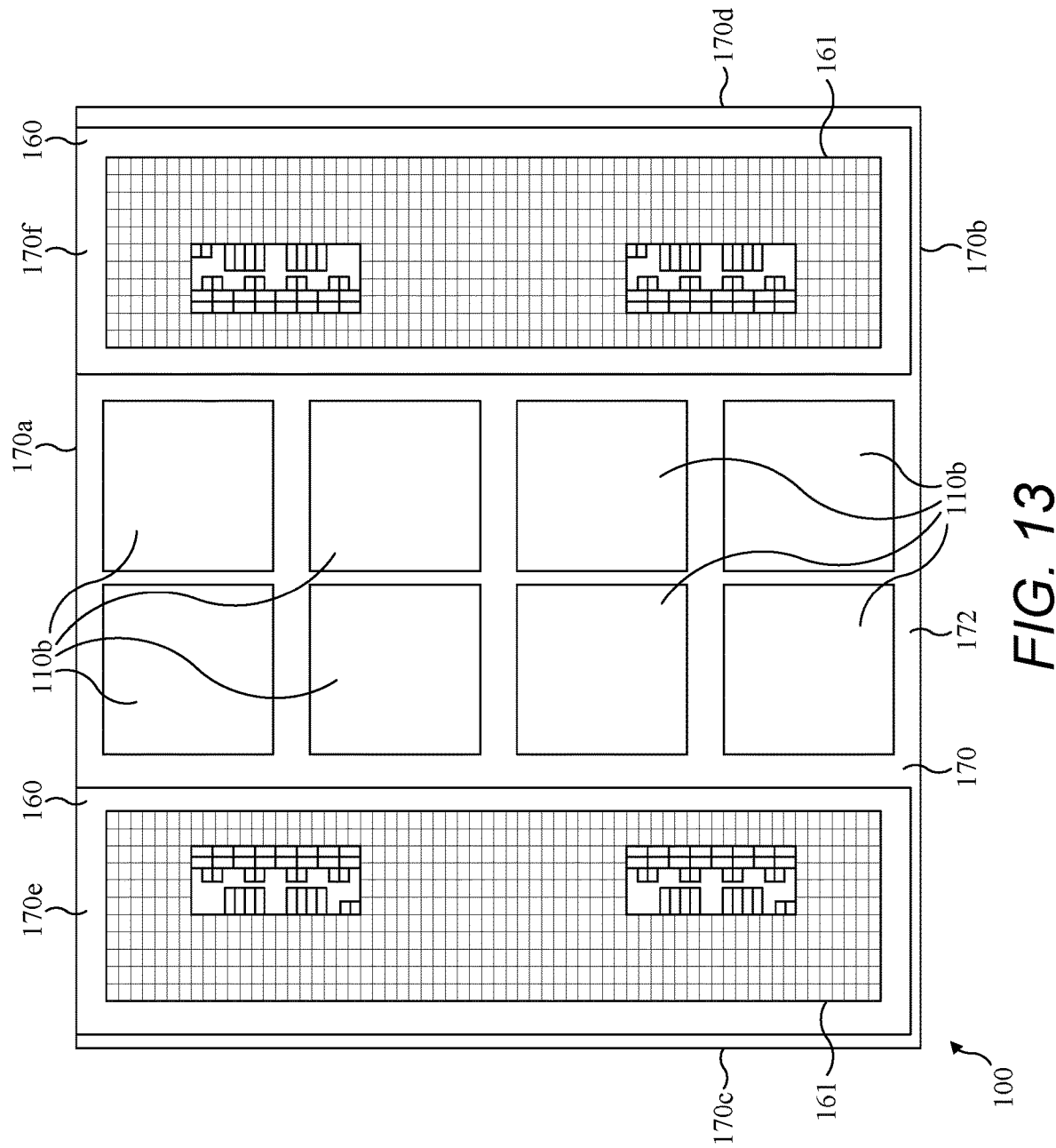
FIG. 13 is a schematic view of the lower surface of the example memory and routing module of FIGS. 11 and 12.

As described herein, each processing chip is capable of implementing a processing or compute function. There are many possible different manifestations of a suitable processing chip. Graphcore have developed a intelligence processing unit (IPU) which is describe for example in U.S. patent application Ser. Nos. 15/886,009; 15/886,053; 15/886,131 [PWF Refs. 408525US, 408526US and 408527US] the contents of which are herein incorporated by reference. FIG. 10 is a highly schematic diagram of an IPU. The IPU comprises a plurality of tiles 103 on a silicon die, each tile comprising a processing unit with local memory. The tiles communicate with each other using a time deterministic exchange. Each tile 103 has instruction storage holding a local program, an execution unit for executing the local program, data storage for holding data, an input interface with a set of input wires and an output interface with the set of output wires. A switching fabric 101 (sometimes referred to as an exchange or exchange fabric) is connected to each of the tiles by the respective sets of output wires and connectable to each of the tiles by their respective sets of input wires via switching circuitry controllable by each tile. A synchronisation module (not shown) is operable to generate a synchronisation signal to switch between a compute phase and an exchange phase. The tiles execute their local programs in the compute phase according to a common clock which may be generated on the die or received by the die. At a predetermined time in the exchange phase, a tile may execute a send instruction from its local program to transmit a data packet onto its output set of connection wires, the data packet being destined for at least one recipient tile but having no destination identifier identifying that recipient tile. At a predetermined switch time, the recipient tile executes a switch control instruction from its local program to control the switching circuitry to connect its inputs set of wires to the switching fabric to receive the data packet at a receive time. The transmit time at which the data packet is scheduled to be transmitted from the transmitting tile, and the predetermined switch time, are governed by the common clock with respect to a synchronisation signal with respect to the synchronisation signal.

The time deterministic exchange allows for efficient transfer between the tiles on the die. Each tile has its own local memory which provides the data storage and the instruction storage. As described herein, the IPU is additionally connected to external memory from which data may be transferred onto the IPU for use by the tiles via the fabric chips.

The tiles 103 of the IPU may be programmed such that a data packet that is transmitted by a SEND instruction from their local program is intended either to access memory (a memory access packet) or to have at its destination another IPU which is connected in the cluster or system. In those cases, the data packet is transmitted onto the switching fabric by the originating tile 103, but is not picked up by recipient tile within the IPU. Instead, the switching fabric causes the tile to be provided to the appropriate connector C1, C2 etc. for external communication from the IPU. The packet intended for off-chip communication is generated to include information which defines its final off-chip destination but not the external port from which it is to be transmitted. The packet may be transmitted to the external port using the principles of the time deterministic exchange to identify the external port for the packet when code is compiled for the tiles. For example, a memory access packet may identify a memory address. A packet intended for another IPU may include the identifier of the other IPU. This information is used by the routing logic on the fabric chip to correctly route the off-chip packets generated by the IPU.

The diagram in FIG. 10 shows five exemplary regions of the exemplary IPU chip, separated by four boundaries 105, represented by dashed lines. Note that the dashed lines represent abstract boundaries 105 of abstract regions on the processor chip, shown for illustrative purposes; the boundaries 105 do not necessarily represent physical boundaries on an IPU chip.

From top to bottom of the diagram in FIG. 10, the regions separated by the boundaries 105 are respectively: an upper beachfront, an upper tile region, a switching fabric region, a lower tile region, and a lower beachfront region.

The description above sets out the logical arrangement of the computer systems described herein, including the processor cores or chips 20, fabric chips 40 and DRAMs 10. Hereinbelow, the physical layout and construction of some elements of the computer systems will be described in further detail.

Turning now to FIGS. 11a to 14b, there is shown a memory and routing module 100 according to an example of the disclosure.

The module 100 comprises a plurality of fabric chips 140, a plurality of DRAMs 110, and two connection components 160. The fabric chips 140 and DRAMs 110 correspond to the fabric chips 40 and DRAMs 10 discussed hereinabove. That is to say, the fabric chips 140 and DRAMs 110 discussed below may incorporate the features discussed above in respect of fabric chips 40 and DRAMs 10. The fabric chips 140 on the module 100 include memory controllers for accessing the DRAMs 110, which will be discussed in more detail below.

The fabric chips 140, DRAMs 110 and connection components 160 are attached to a substrate 170, which takes the form of a planar board. The board may be approximately 80 mm×70 mm, for example 77 mm×69 mm to give a surface area of approximately 5300 to 5400 mm². The structure of the substrate and the attachment of the components thereto will be discussed in more detail below.

An upper side 171 of the substrate 170 supports eight DRAMs 110a, which may for example be arranged in a two x four grid, extending from one edge 170a of the substrate to an opposing edge 170b. The two x four grid of DRAMs 110a is arranged approximately equidistant between two other edges 170c, 170d, effectively forming a strip along the middle of the module 100.

The lower side 172 of the substrate also supports eight DRAMS 110b. The DRAMs 110b on the lower side 172 of the substrate are positioned at locations corresponding to the DRAMs 110a on the upper side 171. In other words, each DRAM 110a on the upper side 171 is positioned directly above a DRAM 110b on the lower side 172.

It will be appreciated that "upper side" and "lower side" used herein are merely labels referring to the two sides of the substrate 170, and that in use the module 100 may be mounted such that the lower side 172 is not below the upper side 171.

Each DRAM 110 may be a DDR (double data rate) DRAM. In one example, each DRAM is an LPDDR (low-power DDR) DRAM, such as an LPDDR5 DRAM. Each DRAM may have a capacity of 16 GB, though in other examples the capacity may be 24 GB or 32 GB. LPDDR DRAMs are designed for mobile computing contexts (e.g. on mobile telephones or laptop computers). However, the inventors have found that such memory can advantageously provide high-capacity, low-latency memory suitable for meeting the demands of artificial intelligence/machine learning models in high-performance computing contexts.

The module 100 further comprises four fabric chips 140, located on the upper side 171. The fabric chips 140 may also be referred to herein as "routing chips" or "memory attachment and routing chips", in view of their above-described function of routing data between different processor cores 20 and between the processor cores 20 and the DRAMS 110. Each fabric chip 140 is positioned in a region 170e or 170f between an edge 170c or 170d of the substrate and the strip of DRAMs 110.

Each fabric chip 140 is proximate to a different pair of DRAMs 110a on the upper side 171, and so consequently, a further pair of DRAMs 110b on the lower side 172. The fabric chip 140 is connected to those four proximate DRAMs 110. In one example, the fabric chip 140 is connected only to those four proximate DRAMs 110.

The module 100 can therefore be divided into four notional quadrants by a first notional line 170y extending between the middle of edge 170a and 170b, and a second notional line 170x extending between, each quadrant comprising a fabric chip 140 and four DRAMs 110a,b connected to the fabric chip 140. The module is reflectionally symmetrical in both lines 170x and 170y. One quadrant 102q of the module 100 is indicated on FIG. 12. Each quadrant 102q can be considered a sub-module of the module 100.

The module 100 comprises two connection components 160 disposed on the lower side 172 of the substrate 170. One connection component 160 is positioned on the underside of region 170e and the other connection component 160 is positioned on the underside of region 170f, and so each connection component 160 is underneath two of the fabric chips 140. Each connection component 160 is configured to mate with a corresponding connection component (420, see FIG. 18) formed on another substrate, such as a motherboard 400. Accordingly, the module 100 is connectable to, and disconnectable from, a motherboard 400 by virtue of the connection components 160. The connection components 160 therefore form the electrical coupling or link between the module 100 and the rest of the system beyond the module 100.

The module 100, and more particularly each fabric chip 140, connects to the processor cores 20 through the connection components 160. Each connection component provides a plurality of connectors as described later. Each fabric chip 140 connects via one or more connectors of the connection component 160 which it is disposed above. Accordingly, the connectors of the connection component 160 can be considered part of the physical embodiment of the links L1-L4 discussed above in relation to FIGS. 5 and 6, in that they are part of the signal path that extends between the processor cores 20 and fabric chips 140.

The connectors of the connection component 160 also provide part of the physical embodiment of the link between each module 100 and other modules 100 in other pods, and the links to the rest of the system. The module 100 therefore does not include a processor core 20, but instead provides routing for data between processor cores 20 as well as memory access. In other words, the only processing power on the module 100 may be that provided in the fabric chips 140. The processor cores 20 are disposed remote from the module 100 and do not form part of the module 100.

Furthermore, as discussed above, there are no high-bandwidth direct connections between fabric chips 140.

Accordingly, each fabric chip 140 on the module 100 is not connected to the other fabric chips 140 on the same module 100.

Each connection component 160 may take the form of a mezzanine connector. The connection components 160 may be hermaphroditic mezzanine connectors, which may for example have eleven rows, each row having fifteen pairs of pins, which may also be referred to as connectors. An example pair of pins 161 is labelled on FIG. 13—for clarity the remaining pins have not been labelled. The mezzanine connector may be a Mirror Mezz connector supplied by Molex®. In other examples, other connection components 160 may be employed. For example, connectors supplied Samtec®, TE Connectivity® or Amephenol® may be used. The connection components 160 may also be part of the physical linkage between the module 100 and the motherboard, providing physical support to the module 100. A more detailed description of the pins 161 is set out below in relation to FIG. 16.

The structure of the substrate 170 and the connections between the elements of the module 100 and the substrate 170 will now be further discussed.

The substrate 170 is a package substrate. Accordingly, the substrate 170 is not a traditional printed circuit board, but instead is a substrate of the type that is typically used inside a chip package to support a die of the chip. The substrate 170 may also be referred to as a high-density interconnect (HDI) substrate or interposer substrate. It will be understood that the use of the term "interposer" in this context does not imply that the substrate acts as an intermediate or interposed layer, but instead is merely a reference to the type of substrate employed. As will be apparent from the description herein, the package substrate 170 is the main substrate of the module 100 and does not act as an interposer.

In one example, the package substrate 170 is a High Tg glass epoxy multilayer material, such as MCL-E-705G provided by Hitachi®.

In one example, the substrate 170 is monolithic. In other words, the substrate 170 is a single, unbroken substrate. In other examples, the substrate 170 may comprise two or more substrates coupled together, either physically, electrically or both.

Figure 14A:
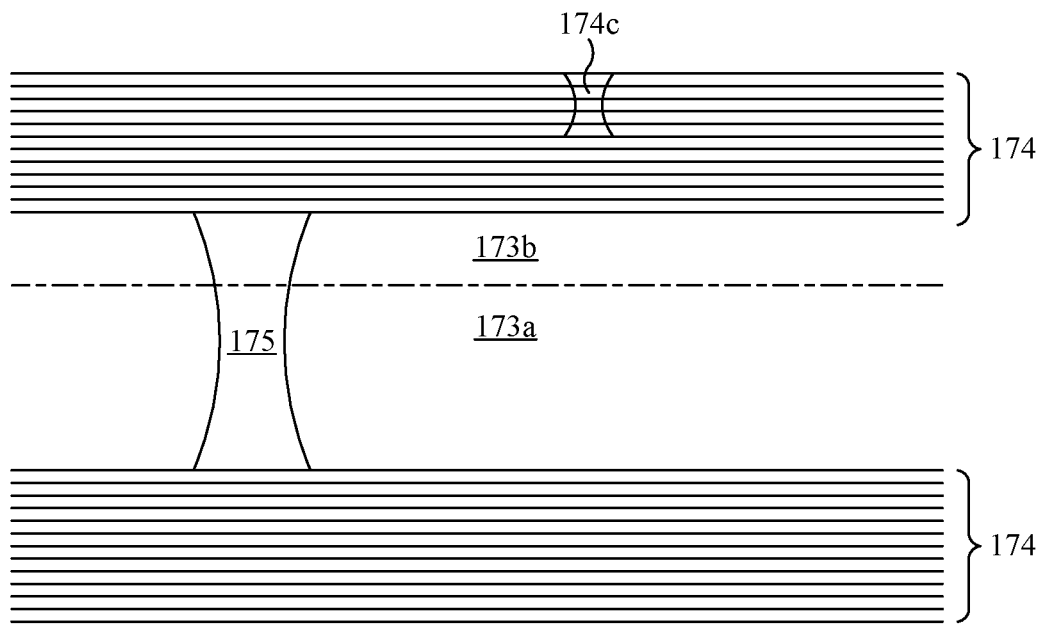
FIGS. 14a and 14b are schematic views of a substrate of the example memory and routing module of FIGS. 11 to 13.

As shown in FIG. 14a, the package substrate 170 comprises a core 173, and a plurality of build-up layers 174 formed on the core 173. The core 173 has two layers 173a, 173b, the first core layer 173a being insulative and acting to provide strength to the substrate. The second core layer 173b may be a copper layer. The core 173 may be approximately 1.2 mm in thickness.

Figure 14B:
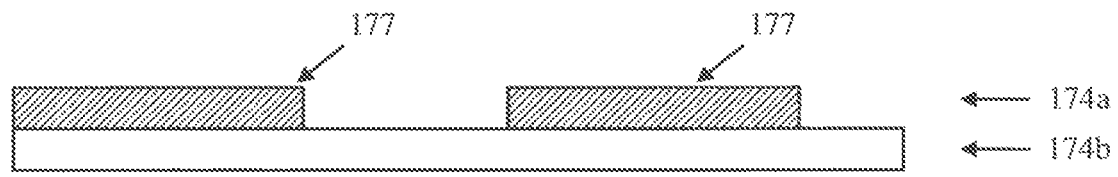

The build-up layers 174, which are shown in more detail in FIG. 14b, each carry a plurality of conductive lines or wires 177 that electrically connect the elements of the module 100. The build-up layers 174 may each comprise a copper foil sublayer 174a from which the conductive lines are formed and an insulative sublayer 174b, to isolate each build-up layer 174 from other build-up layers 174. Each copper foil sublayer 174a may be approximately 12 microns thick. Each insulative sublayer 174b may be approximately 30 microns thick. Accordingly, it will be appreciated that FIG. 14 is not to scale and exaggerates the size of the build-up layers 174 relative to the core 173.

In one example, six build-up layers 174 are formed on each side of the core 173, to give a 6:2:6 package substrate. The build-up layers 174 on one side of the substrate 170 may each have a different function. For example, one or more of the layers 174 may be a ground layer comprising conductive lines 177 connected to ground. One or more of the layers may be a VDD layer, comprising conductive lines 177 connected to VDD. One or more of the layers 174 may be a signal layer, carrying signals between the connection components 160 and the fabric chips 140, and between the fabric chips 140 and the DRAMs 110. In one example, two of the build-up layers 174 are signal layers. The outermost layer 174 may comprise pads (not shown) for connection to the other elements of the module 170.

Furthermore, as illustrated in FIG. 14a, vias 174c may be formed between build-up layers 174, so that the conductive lines 177 may pass between layers 174. In addition, core vias 175 may also be formed through the core 173, so that the conductive lines 177 may pass from the upper side of the substrate 170 to the lower side of the substrate 170.

The fabric chips 140 are flip chips, secured directly to the substrate 170. In other words, the fabric chips 140 are semiconductor chips fabricated to include solder bumps on a surface of the die thereof. These bumps are then directly attached to the substrate 170. In one example, the bump pitch in a core region of the chip is approximately as follows:

x=261 microns
y=154 microns
diagonal pitch=151 microns where x is the width direction between long edges of the chip, and y is the length direction between short edges of the chip. The pitch may be wider in areas where the connection is provided to the DRAMs 110, for example x=286 microns, y=164 microns, diagonal pitch=167 microns. The structure and function of the fabric chips 140 will be discussed in further detail below, with reference to FIG. 15.

The conductive lines 177 of the package substrate 170 are sufficiently fine in the regions of the substrate 170 under each fabric chip 140 to allow the lines to breakout from the footprint of the chips 140.

The DRAMs 110 are attached to the substrate 170 using a ball grid array (BGA). That is to say that the DRAMs 110 each take the form of a packaged semiconductor chip comprising a die and a package substrate. The die is secured to the upper side of the package substrate, and electrically connected thereto. The package substrate has a grid of solder balls formed on the underside thereof, which are in turn secured to corresponding conductive pads on the substrate 170. The BGA may for example have a pitch of 650 microns. The pitch of the balls is therefore substantially coarser than the bumps of the fabric chip 140.

The connection components 160 may also be connected to the substrate 170 via a BGA. Each connection component 160 therefore may comprise a grid of solder balls disposed on a face of the connection component 160 opposing the face including the pins 161.

Figure 15:
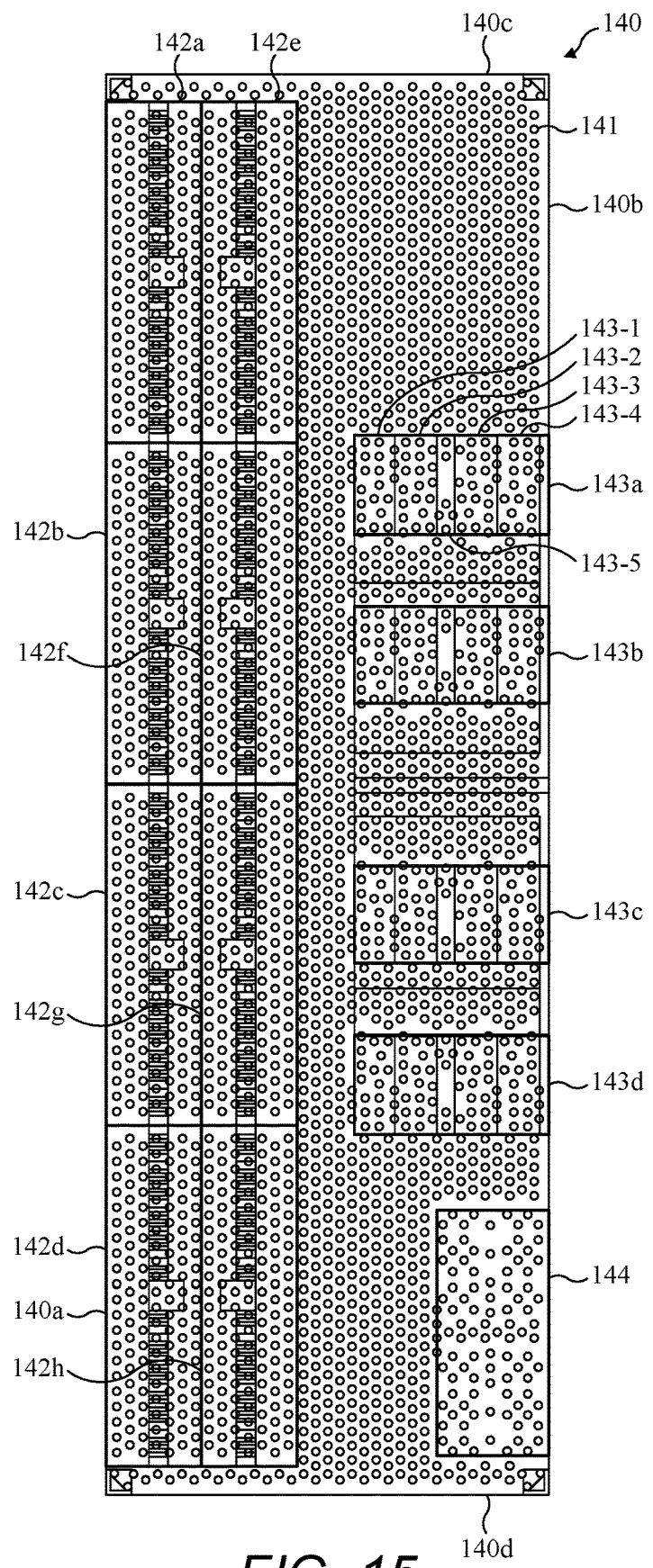
FIG. 15 is a schematic diagram of the layout of an example fabric chip.

FIG. 15 illustrates the structure of the fabric chip 140 in more detail. The bumps formed on the underside of the fabric chip 140 are illustrated as small circles, generally indicated by the number 141, for connection to the substrate. The blocks 142,143,144 shown on FIG. 15 illustrate the regions in which certain circuits are disposed within the fabric chip 140.

The die of the fabric chip 140 is rectangular and has two opposing long edges 140a, 140b and two opposing short edges 140c, 140d. The short edges 140c, 140d are approximately 6 mm long. The long edges 140a, 140b are approximately 15 mm long. In one example, each fabric chip is 5.5 mm×15.3 mm. Accordingly, the aspect ratio of the chip 140 is approximately 3:1. In one example, the fabric chip 140 is a single or monolithic die.

The fabric chip 140 comprises a plurality of memory controllers 142a-h. Each memory controller 142 is a circuit formed in the die of the chip, which acts as an interface to the DRAMs 110. In examples where the DRAMs are LPDDR DRAMs, the memory controllers 142 are LPDDR interfaces. The LPDDR interfaces implement the relevant LPDDR standard (e.g. a JEDEC standard, for example JESD209-5B). In examples where the DRAMs 110 are of a different type, the memory controllers 142 may accordingly implement the standard necessary to access the DRAMs 110.

As discussed above, each fabric chip 140 is associated with two DRAMs 110 on the upper side and two DRAMs 110 on the lower side 172. Each of these DRAMs 110 may have a plurality of memory channels, for example four channels. Each DRAM 110 may thus be a quad-channel DRAM. The fabric chip 140 comprises a number of memory controllers 142 sufficient to access the channels of the DRAMs 110. In the example shown, the fabric chip 140 comprises eight memory controllers 142a-h, each memory controller 142 being a dual-channel memory controller 142. This provides the necessary sixteen channels for accessing four quad-channel DRAMs. In one example, the memory channels are each 16-bit wide.

As can be seen in FIG. 15, the memory controllers 142 are arranged on one long side 140a of the chip 140. Each chip 140 is arranged on the module 100 so that this side 140a faces the DRAMs 110. This arrangement may ease breaking out the connections to the DRAMs 110 from under the footprint of the chip 140.

The memory controllers 142 may also be arranged in a two x four grid, with a first four of the memory controllers 142a-d arranged most proximate to the long side 140a and a second four of the memory controllers 142e-h are arranged inward of the first four memory controllers 142a-d. The first four of the memory controllers 142a-d may communicate with the DRAMs 110 on the upper side 171 of the substrate 110. The second four memory controllers 142e-h may be arranged to access the DRAMs 110 on the lower side 172, through core vias 175 formed under the fabric chip 140. This arrangement also helps to ease the breakout from under the footprint of the chip 140.

A plurality of bumps 141 of the fabric chip 140 are disposed under each memory controller 142, at least some of which are memory attachment connectors, in electrical communication with a DRAM 110 via the conductive lines 177 in the substrate 170. In other words the bumps 141 under each memory controller include a memory attachment port, which may be connected to a DRAM 110. Other bumps under each memory controller 142 may be connected to a memory controller power supply or ground.

Each memory controller 142 forms part of the DDR interface blocks 48 discussed above. Accordingly, the routing logic of the fabric chip 140 is configured to route data to and from the DRAMs 110 via the memory controllers 142.

The fabric chip 140 furthermore comprises a plurality of link controllers 143, 144. Each link controller 143, 144 may comprise a circuit formed in the die. A first group of link controllers 143 each comprise four communication lanes, labelled 143-1 to 143-4. Only one of the link controllers 143 is labelled in this manner to improve the clarity of the figure.

Each communication lane 143-1 to 143-4 forms separate communication link to an external device (i.e. a device not on the module 100). Accordingly, at least some of the bumps 141 under each lane 143-1 to 143-4 of the link controllers 143 form external link ports or connectors. The external link ports are connected via conductive lines 177 to a connection component 160. The bumps 141 may comprise bumps for transmitting signals and bumps for receiving signals.

Each communication lane 143-1 to 143-4 may be a serial link, such as a SERDES link as discussed above. Accordingly, the link controller 143 may comprise an analogue circuit. In one example, the link controllers 143 provide 100 Gbps links.

In addition to the four communication lanes 143-1 to 143-4, the link controller 143 may also comprise a common region 143-5, which provides common functions to the four lanes 143-1 to 143-4, such as a common clock signal for each of the communication lanes.

Three of the link controllers (labelled 143a-c) provide communication lanes for communication with respective processor cores 20. Accordingly, each fabric chip 140 has twelve communication lanes for communication with processor cores 20. As discussed above in relation to FIG. 9, three links (e.g. L2a, L2b, L2c) are provided to each processor core. Accordingly, each communication lane corresponds to an EPC (e.g. EPC2a, EPC2b, EPC2c) shown on FIG. 9. The twelve communication lanes on the fabric chip 140 therefore provide connections to four processor cores 20.

A further link controller (labelled 143d) provides four more communication lanes. This may comprise three lanes of pod-facing communication. The communication lanes may implement EPCs corresponding to Pa, Pb, Pc of FIG. 9 to implement pod-facing links PLa, PLb, PLc. The pod-facing links PL may also be termed cluster connecting links, in that they connect the fabric chip to another cluster.

The link controller 143d may also comprise a lane of system facing communication. Accordingly, one of the communication lanes implements an EPC (i.e. corresponding to PCS of FIG. 9) to provide the system link SL. The system link SL is for example connected to a switching fabric.

The link controller 144 provides a PCIe link to a host computer. The link controller 144 may comprise two sub-controllers (not shown), each implementing four lanes of communication. The link controller 144 may provide lower speed connectivity when compared to link controllers 143.

The link controllers 143, 144 may be arranged along the opposite long edge 140b to the memory controllers 142. Again, this may assist in easing the breakout of lines from under the fabric chip 140.

In one example, the link controller 144 is only operational on one of the four fabric chips 140 on the module 100. The link controllers 144 of the other three fabric chips 140 may not be connected to the connection components 160, and thus unable to communicate with the host.

The remaining bumps 141 of the fabric chip 140 that are not under one of the controllers 142, 143, 144 may comprise main chip power supply bumps and ground bumps. The main chip power supply may be a different power supply to the memory controller 142 power supply. In addition, some of the bumps 141, for example those in the corners of the chip 140, may be dummy bumps that are not electrically connected. These dummy bumps are most affected by the different thermal expansion properties of the substrate 170 and the chip 140, and thus cannot be used to reliably carry signals.

Figure 16:
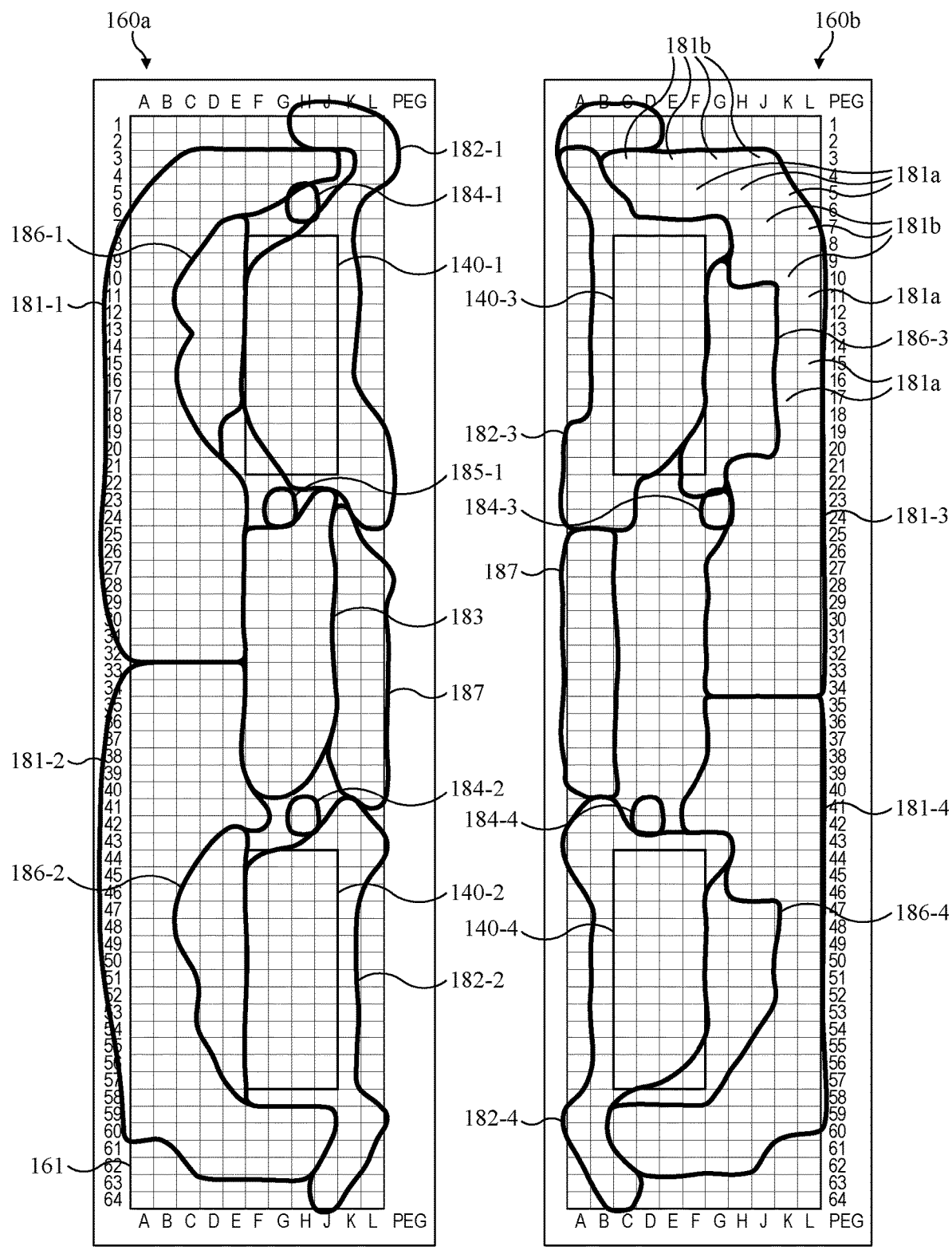
FIG. 16 is a schematic diagram illustrating the pins of connection components of the example memory and routing module of FIGS. 11-13

FIG. 16 shows the two connection components 160a, 160b in more detail, with the other components of the module 100 omitted for clarity, apart from boxes representing the location of the fabric chips 140 with respect to connection components 160.

Approximately half of the pairs of pins 161 are VSS or ground pins. Accordingly, in each group of pins discussed hereinbelow, approximately half of the pairs of pins will carry out the relevant function, and approximately half will act as VSS.

The connection components 160 comprise groups of pins 181 that carry the signals to and from the link controllers 143. Accordingly, these pins 181 may act as SERDES links. One group of pins 181 carry the signals to and from a particular fabric chip 140. Particularly, the pins 181-1 carry signals to and from fabric chip 140-1, the pins 181-2 carry signals to and from fabric chip 140-2, the pins 181-3 carry signals to and from fabric chip 140-3 and the pins 181-4 carry signals to and from fabric chip 140-4. The pins forming the SERDES links 181 are generally arranged towards the outer edges of the connection components 160 (i.e. on the side of the connection components furthest from the DRAMs 110).

Each group of pins 181 may include transmitting pins 181a and receiving pins 181b, respectively configured for the transmission and receipt of signals. Only a selection of the transmitting pins 181a and receiving pins 181b of pins 181-1 are labelled to preserve the clarity of the figures. It will be understood that the other groups of pins 181 include similarly arranged transmitting 181a and receiving pins 181b. In the example shown in FIG. 16, the transmitting 181a and receiving pins 181b are interspersed. In other words, transmitting pins 181a and receiving pins 181b are distributed throughout the group 181, such that a transmitting pin 181a may be located adjacent (i.e. be a neighbour of) a receiving pin 181b. Adjacent or neighbour in this context includes pairs of pins that are arranged diagonally with respect to one another.

The connection components 160 also comprise groups of pins 182 that carry the power supply for the fabric chips. In one example, the power supply carried by the pins 182 is a main digital power supply for the fabric chips 140. One group of pins 182 supplies a particular fabric chip 140, with the group and having the same suffix (i.e. −1, −2 etc). The power supply pins 182 are generally arranged under the fabric chip 140 they supply.

The connection components 160 comprises a group of pins 183 that carry the PCIe link to the host computer, and thus are in communication with link controller 144. As discussed above, only one of the fabric chips (e.g. fabric chip 140-1) may have its link controller 144 connected. Accordingly, only one of the connection components 160a may include the PCIe link pins 183. The pins 183 are generally arranged toward the middle of the connection component 160a.

The connection components 160 further comprise clock pins 184-1 to 184-4, carrying a clock signal for the link controllers 143 of the respective fabric chips 140. Furthermore, the connection component 160a may include a clock pin 185-1 for the PCIe controller. Only one clock pin 185-1 may be provided, as only one fabric chip 140 has the PCIe link enabled.

The connection components 160 may also include pins 186 providing a power supply for the link controllers 143. Particularly, the pins 186 supply power for a PHY or analogue component of the link controllers 143. The link controllers 143 (and the PHY in particular) may require a different power supply from the main digital power supply. For example, the link controllers may require a less noisy power supply. The connection components 160 may further include pins 187 providing a power supply to the DRAMs 110.

Figure 19:
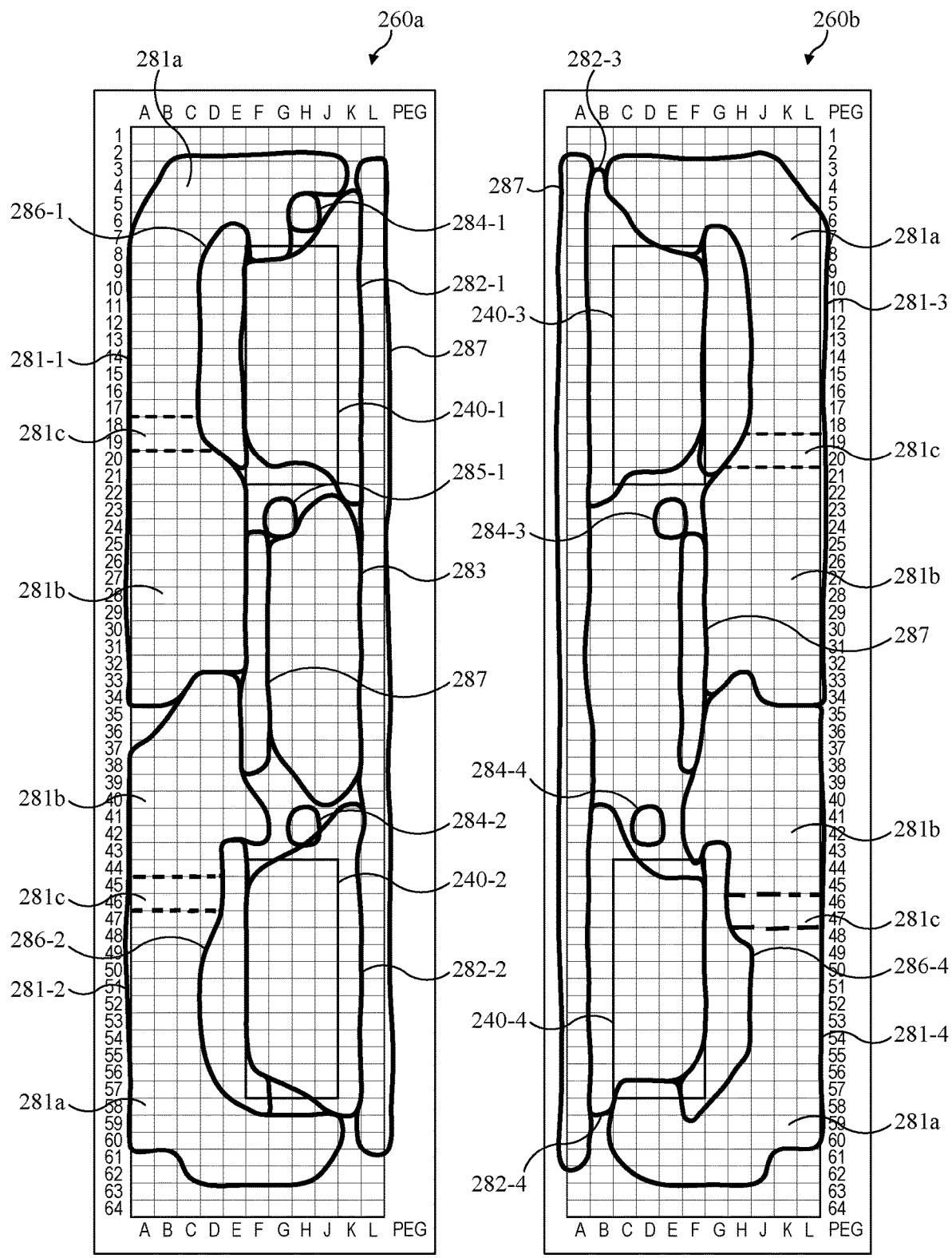
FIG. 19 is a schematic diagram illustrating the pins of another example pair of connection components that may be used with the memory and routing module of FIGS. 11-13.

FIG. 19 shows an example of another pair of connection components 260a,b. The connection components 260 operate similarly to the connection components 160, with corresponding elements having the corresponding reference numerals incremented by 100. For clarity, only the differences are discussed in detail below.

The connection components 260 include groups of pins 281 that carry the signals to and from the link controllers, corresponding in function to pins 181 discussed above. In contrast to pins 181, in each group of pins 281 transmitting pins 281a are separated from receiving pins 281b. That is to say, no transmitting pin 281a is located adjacent to a receiving pin 281b. In this example, adjacent includes pins that are diagonally adjacent.

For example, each group 281 may comprise a region comprising transmitting pins 281a and a region comprising receiving pins 281b. In other words, the transmitting pins 281a and receiving pins 281b each respectively form a contiguous region. The two regions 281a and 281b are separated from one another by a group 281c of ground pins. The group 281c of ground pins form a buffer or separation region between the transmitting and receiving pins 281a,b.

In addition, the transmitting pins 281a associated with one fabric chip 240 are also disposed so as not to neighbour transmitting pins 281a associated with another fabric chip 240. For example, the transmitting pins 281a of group 281-1 associated with fabric 240-1 are disposed at or towards one end of the connection component 260, whereas the transmitting pins 281a of group 281-2 associated with fabric chip 240-2 are disposed at or towards the opposing end of the connection component 260. The receiving pins 281b of the two groups 281-1, 281-2 may however be arranged adjacent each other.

Separating transmitting pins 281a from receiving pins 281b has been advantageously found to reduce or prevent near-end crosstalk (NEXT) between the transmitting pins 281a and receiving pins 281b. NEXT arises due to the relative difference in signal strength between transmitted signals and received signals, caused by signal degradation and attenuation as the signal travels between the point of transmission and the point of receipt. Accordingly, the signals transmitted via transmitting pins 281a are substantially higher gain than the signals received via receiving pins 281b, thus causing crosstalk.

In addition, in connection components 260a,b differ from connection components 160a,b in that the pins disposed along the long edge of the connection component 260 most proximate to the DRAMs 110 are used as DRAM power supply pins 287. It will be understood that the features of the connection components 160 and 260 may be combined or interchanged.

Figure 18:
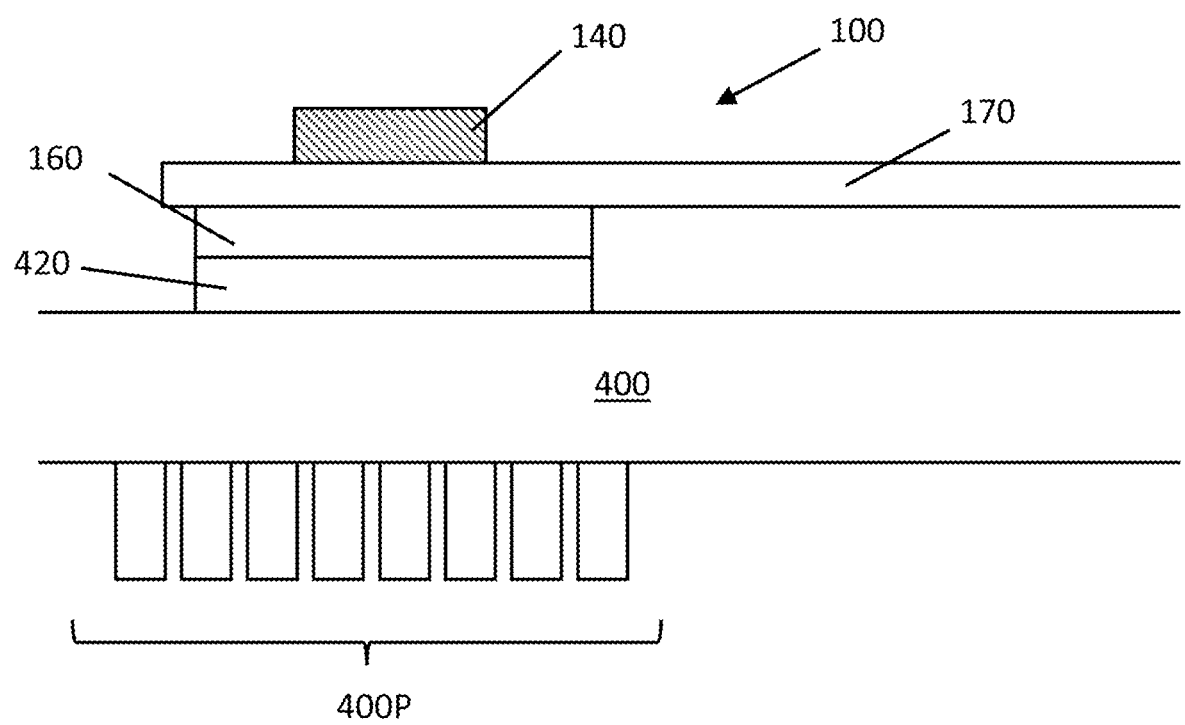
FIG. 18 is a schematic cross section view of the example memory and routing module of FIGS. 11 to 13 and a motherboard.

FIG. 18 illustrates an example power supply arrangement for the module 100. As shown in FIG. 18, the motherboard 400 to which the module 100 may be attached comprises power supply components 400P. The power supply components 400P may for example comprise a point of load power supply, disposed on an opposing side of the motherboard 400 to the module 100. Power is supplied from the power supply components 400P through the connection components 420 and 160 to the fabric chip 140.

Accordingly, the module 100 may not comprise a power supply, such as a point of load power supply. This allows the substrate 170 to be made smaller, reducing the use of the relatively high cost substrate material. Furthermore, the positioning of the fabric chip 140 on the other side of the substrate 170 directly above the connection component 160 minimises the distance between the power supply components 400P and the fabric chip 140, reducing the IR drop.

Figure 17:
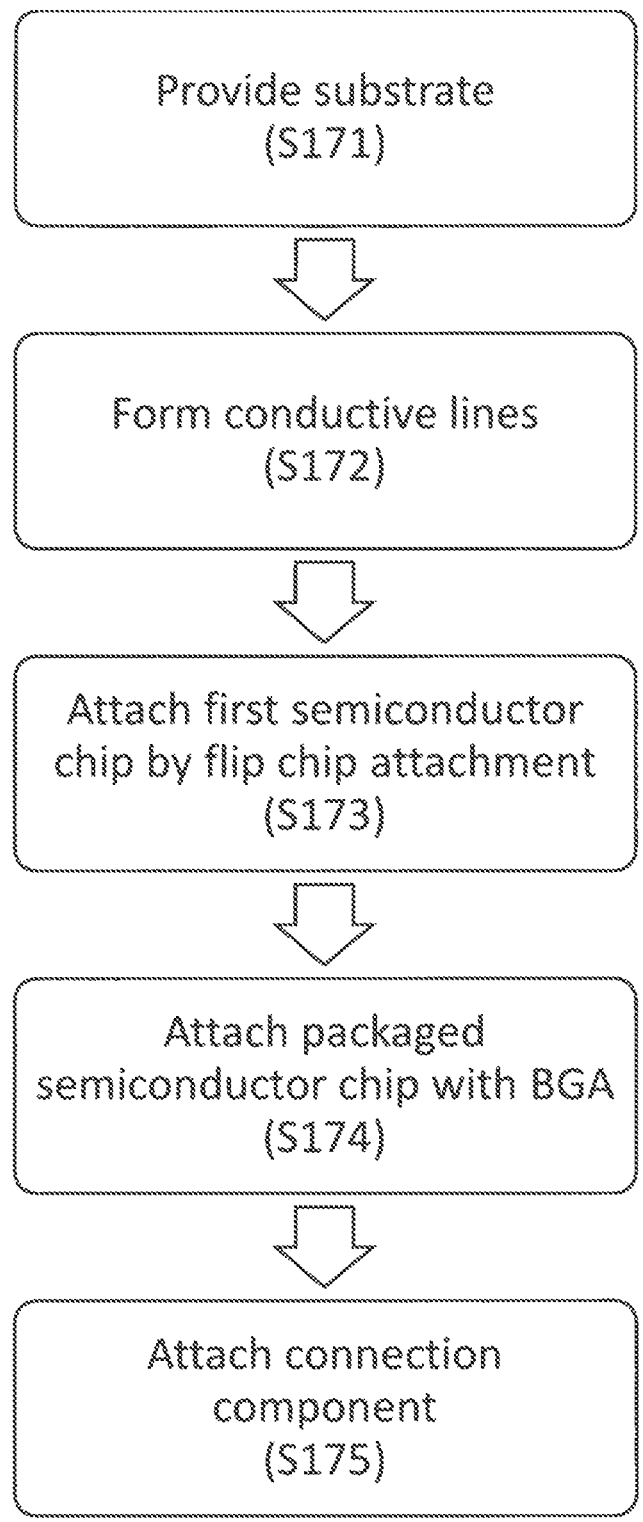
FIG. 17 is a schematic flowchart of an example method of manufacturing a memory and routing module.

FIG. 17 illustrates a method of manufacturing an example module 100.

The method comprises providing a substrate (S171). As discussed above, the substrate may be a package substrate 170, having a plurality of layers 174. The substrate may be formed by repeatedly depositing copper foil sublayers 174a and insulative sublayers 174b on a core 173. In some examples, the layers 174 may be provided on both sides of the core 173. In some examples, vias 174c are formed between layers and/or vias 175 are formed through the core 173, for example by laser drilling.

In step S172, conductive lines 177 are formed in the substrate 170. In one example, the lines 177 are formed by etching the copper foil sublayers 174a. However, other methods may be employed to form the conductive lines 177. The conductive lines 177 may pass through the vias 174c, 175.

In step S173, a first semiconductor chip is attached directly to the substrate 170 by flip chip attachment. The first chip may be the fabric chip 140. Solder bumps formed on the first chip may be attached to corresponding pads formed on the substrate 170, by heating the module 100. The heating of the module 100 may occur by passing the module 100 through a suitable oven. Each of a plurality of first chips (e.g. the four fabric chips 140) may be attached at the same time, for example in the same pass through the oven or other heating cycle.

In some examples, the first chips are underfilled with an underfill material such as an epoxy resin. The underfill material may be provided as a liquid, with capillary action caused by the narrow gaps formed between the underside of the chip and the substrate drawing the liquid between the solder bumps. The underfill may then be cured by a further heating cycle, which may be cooler than the heating cycle used to melt the solder bumps. The underfill helps to redistribute stress caused by the differing coefficients of thermal expansion of the chip and the substrate.

In step S174, packaged semiconductor chips having a BGA are attached to the substrate. The packaged semiconductor chips may be the DRAMs 110 discussed herein. The solder balls of the BGA of the packaged chip may be attached to corresponding pads formed on the substrate, by heating the module 100 for example by passing it through a suitable oven. The heating of the module 100 to attach the packaged semiconductor chips may be a separate heating cycle to the heating cycle for attaching the first semiconductor chips. The underfilling of the first semiconductor chips may ensure the first chips remain attached to the substrate during the subsequent heating of the module to attach the packaged semiconductor chips.

Step S174 may comprise attaching packaged semiconductor chips to one side of the substrate (e.g. the upper side 171), followed by subsequently attaching packaged semiconductor chips to the other side of the substrate (e.g. the lower side 172). There may therefore be two separate heating cycles—one for attaching the BGAs to each side of the substrate. In other examples, BGAs on both sides of the substrate 170 may be attached in a single heating cycle.

In Step S175, the connection components 160 are attached to the substrate. In one example, the connection components 160 have a BGA. The solder balls of the BGA of the connection component may be attached to corresponding pads formed on the substrate, by heating the module 100 for example by passing it through a suitable oven. In some examples, the connection components 160 are attached to the substrate in a further heating cycle, subsequent to the attachment of the packaged semiconductor chips. In other examples, the connection components 160 may be attached by the same heating cycle as one or more of the packaged semiconductor chips. For example, the connection components 160 may be attached to the lower side 172 by the same heating cycle that attaches the packaged semiconductor chips to the substrate 170.

The order of the steps may be varied in some examples. For example, the packaged semiconductor chips and/or connection components 160 may be secured to the substrate before the first chip is flip chip attached.

Various modifications may be made to the module 100 described above. In some examples, the number of fabric chips 140 and DRAMS 110 present in the module 100 may be varied from the examples discussed above. For example, each fabric chip 140 may be connected to fewer DRAMs 110 (i.e. 1, 2 or 3 DRAMs) or more DRAMs 110 (5 or more DRAMs, for example 8 DRAMs). In other examples, the module 100 may comprise fewer fabric chips 140 or more fabric chips 140. The module 100 may comprise fewer of the notional quadrants discussed above (e.g. 2 of the quadrants, 6 of the quadrants, 8 of the quadrants or any other suitable number). In some examples, the number of connection components 160 provided may also be varied. For example, only one connection component 160, or more than two connection components 160 may be provided. Furthermore, the elements of the fabric chip 140 may be varied. For example, the fabric chip 140 may comprise more or fewer memory controllers and/or link controllers, for communication with different numbers of DRAMs 110, processor cores 20 and other quads or pods. The position of the memory controllers 142 and link controllers 143, 144 may be varied on the fabric chip 140. The bumps of the fabric chip 140 may have different functions and/or be arranged differently. The pins 161 of the connection component 160 may be arranged differently and/or have different functions.

Advantageously, the module 100 provides routing functionality and a high-capacity, high-bandwidth and low-latency memory for a processor core 20, rendering it suitable for the processing of large machine learning models. When arranged as shown in FIG. 8 with a ratio of two modules 100 to each processor core 20, each processor has access to 512 GB at an example bandwidth of 9.6 Tbit/s. Furthermore, the use of module 100 limits the links required on the processor core 20, saving valuable beach front space that would ordinarily be used for memory access and routing.

Advantageously, the module 100 comprises directly flip-chip attached fabric chips 140 and DRAMs 110 and connection components 160 attached to the module 100 via BGAs. By permitting direct flip-chip attachment of the fabric chips 140 to the substrate, the fabric chips 140 do not require additional packaging, and thus the overall size of the module 100 can be reduced.

The invention claimed is:

1. A memory and routing module comprising:
a substrate;
a connection component attached to the substrate, the connection component comprising a plurality of pins to mate the module to a corresponding connection component on a motherboard;
a dynamic random access memory (DRAM) chip disposed on the substrate; and
a routing chip attached to the substrate, the routing chip comprising a memory controller, a plurality of connections and routing logic, wherein:
the plurality of connections include a first group of connections between the memory controller and the DRAM chip and a second group of connections with the pins of the connection component, and the routing logic is configured to detect packet information in a data packet and route the data packet between the second group of connections and the first group of connections based on the packet information.

2. The memory and routing module of claim 1, wherein the DRAM chip forms part of a DRAM chip package comprising a ball grid array (BGA), the BGA connecting the DRAM chip package to the substrate.

3. The memory and routing module of claim 1, wherein the routing chip comprises a plurality of bumps by which the routing chip is secured directly to the substrate by flip chip securement.

4. The memory and routing module of claim 1, wherein the module comprises a plurality of DRAM chips disposed on the substrate, and the routing chip comprises a plurality of memory controllers, each memory controller connected to a respective DRAM chip of the plurality of DRAM chips by the plurality of connections.

5. The memory and routing module of claim 4, comprising four DRAM chips connected to the routing chip.

6. The memory and routing module of claim 4, wherein a first one of the plurality of DRAM chips is disposed on a first surface of the substrate, and a second one of the plurality of DRAM chips is disposed on a second surface of the substrate.

7. The memory and routing module of claim 1, comprising a plurality of routing chips and a plurality of DRAM chips disposed on the substrate, each routing chip including a memory controller connected to a respective DRAM chip.

8. The memory and routing module of claim 1, wherein the connection component is a mezzanine connection component.

9. The memory and routing module of claim 1, wherein:
the routing chip is disposed on a first side of the substrate, and
the connection component is attached at a first position corresponding to a second position of the routing chip on a second side of the substrate, and
the routing chip is configured to receive power by the connection component from a power supply component electrically coupled to the connection component.

10. The memory and routing module of claim 9, further comprising a plurality of vias in the substrate forming a plurality of electrical pathways to connect the connection component to the routing chip.

11. The memory and routing module of claim 1, wherein the DRAM chip comprises a low-power double data rate (LPDDR) memory, and the memory controller comprises an LPDDR interface.

12. The memory and routing module of claim 1, wherein the memory controller is arranged on a long edge of a die of the routing chip, the long edge of the die facing the DRAM chip.

13. The memory and routing module of claim 1, wherein:
the second group of connections comprises a plurality of processor connections, each configured for attachment to respective processor chips, and
the routing logic is configured to route signals from one of the processor connections to another of the processor connections.

14. The memory and routing module of claim 13, wherein the processor connections comprise Serializer/Deserializer (SERDES) connections.

15. The memory and routing module of claim 13, wherein:
the plurality of pins comprise processor connection pins configured to carry the plurality of processor connections; and
the processor connection pins comprise transmitting pins and receiving pins, and the receiving pins are disposed so as not to neighbour the transmitting pins.

16. The memory and routing module of claim 1, wherein the substrate is a package substrate comprising a plurality of conductive lines, the first group of connections and second group of connections being by the plurality of conductive lines.

17. A system comprising:
a memory and routing module comprising:
a substrate;
a connection component attached to the substrate, the connection component comprising a plurality of pins to mate the module to a corresponding connection component on a motherboard;
a dynamic random access memory (DRAM) chip disposed on the substrate; and
a routing chip attached to the substrate, the routing chip comprising a memory controller, a plurality of connections and routing logic, wherein:
the plurality of connections include a first group of connections between the memory controller and the DRAM chip and a second group of connections with the pins of the connection component; and
the routing logic is configured to detect packet information in a data packet and route the data packet between the second group of connections and the first group of connections based on the packet information; and
a plurality of processor chips connected to the memory and routing module by the connection component.

18. The system of claim 17, wherein:
each processor chip is not in direct electrical communication with other processor chips, and
each processor chip is configured to communicate with other processor chips by the routing chip or by another routing chip on the substrate.

19. The system of claim 17, wherein the plurality of processor chips implement time deterministic processing.

20. A computer system comprising:
a first processor chip and a second processor chip mounted on a board; and
a memory and routing module mated to the board and in electrical communication with the first processor chip and the second processor chip through a plurality of electrical connection components, wherein the memory and routing module includes:
a dynamic random access memory (DRAM) chip disposed on a substrate; and
a routing chip disposed on the substrate, the routing chip having a memory controller and a plurality of connections, including a first group of connections between the memory controller and the DRAM chip and a second group of connections with the plurality of electrical connection components;
wherein the routing chip is configured to provide both the first processor chip and the second processor chip access to the DRAM chip, and wherein the routing chip is further configured to allow the first processor chip to communicate with the second processor chip by detecting packet information in data packets and routing the data packets between the first processor chip and the second processor chip based on the packet information.

21. The computer system of claim 20, wherein the DRAM chip is included in a plurality of DRAM chips disposed on the substrate, and wherein the memory controller is included in a plurality of memory controllers, each memory controller of the plurality of memory controllers connected to a respective DRAM chip of the plurality of DRAM chips by the plurality of connections.

22. The computer system of claim 21, wherein a first one of the plurality of DRAM chips is disposed on a first surface of the substrate, and a second one of the plurality of DRAM chips is disposed on a second surface of the substrate.

23. The computer system of claim 20, wherein the routing chip is included in a plurality of routing chips disposed on the substrate, and wherein the DRAM chip is included in a plurality of DRAM chips disposed on the substrate, further wherein each routing chip of the plurality of routing chips is connected to a respective DRAM chip of the plurality of DRAM chips.

24. The computer system of claim 20, wherein:
the routing chip is disposed on a first side of the substrate,
the plurality of electrical connection components is attached at a first position corresponding to a second position of the routing chip on a second side of the substrate, and
the routing chip is configured to receive power by the plurality of electrical connection components from a power supply component electrically coupled to the plurality of electrical connection components.

25. The computer system of claim 24, further comprising a plurality of vias in the substrate forming a plurality of electrical pathways between the plurality of electrical connection components and the routing chip.

* * * * *